United States Patent
Ganeshamurugan et al.

(10) Patent No.: US 9,252,383 B2
(45) Date of Patent: Feb. 2, 2016

(54) CATHODE COATING

(75) Inventors: Subramaniam Ganeshamurugan, Barking (GB); Poopathy Kathirgamanathan, North Harrow (GB); Sivagnanasundram Surendrakumar, Middlesex (GB); Seenivasagam Ravichandran, London (GB); Yun Fu Chan, Ingleby Barwick (GB)

(73) Assignee: Merck Patent Gmbh (DE)

( * ) Notice: Subject to any disclaimer, the term of this patent is extended or adjusted under 35 U.S.C. 154(b) by 1022 days.

(21) Appl. No.: 12/309,575

(22) PCT Filed: Jul. 26, 2007

(86) PCT No.: PCT/GB2007/050447
§ 371 (c)(1),
(2), (4) Date: Jul. 29, 2010

(87) PCT Pub. No.: WO2008/012581
PCT Pub. Date: Jan. 31, 2008

(65) Prior Publication Data
US 2010/0289009 A1    Nov. 18, 2010

(30) Foreign Application Priority Data
Jul. 26, 2006 (GB) .................. 0614849.8

(51) Int. Cl.
H01L 51/54    (2006.01)
H01L 51/50    (2006.01)
H01L 51/00    (2006.01)

(52) U.S. Cl.
CPC ........ H01L 51/5092 (2013.01); H01L 51/0077 (2013.01); H01L 51/009 (2013.01); H01L 51/5088 (2013.01)

(58) Field of Classification Search
None
See application file for complete search history.

(56) References Cited

U.S. PATENT DOCUMENTS

| | | | |
|---|---|---|---|
| 4,356,429 A | 10/1982 | Tang | |
| 4,720,432 A | 1/1988 | Van Slyke et al. | |
| 4,769,292 A | 9/1988 | Tang et al. | |
| 5,776,622 A | 7/1998 | Hung et al. | |
| 5,925,472 A | 7/1999 | Hu et al. | |
| 6,208,075 B1 | 3/2001 | Hung et al. | |
| 6,524,727 B1 | 2/2003 | Kathirgamanathan et al. | |
| 6,558,817 B1 | 5/2003 | Ueda et al. | |
| 6,565,995 B1 | 5/2003 | Kathirgamanathan et al. | |
| 6,565,996 B2 | 5/2003 | Hatwar et al. | |
| 6,605,317 B1 | 8/2003 | Kathirgamanathan et al. | |
| 6,717,354 B1 | 4/2004 | Kathirgamanathan et al. | |
| 6,885,149 B2 | 4/2005 | Parthasarathy et al. | |
| 7,114,638 B2 | 10/2006 | Vaynshteyn et al. | |
| 7,183,008 B1 | 2/2007 | Kathirgamanathan et al. | |
| 2002/0071964 A1 | 6/2002 | Oh et al. | |
| 2003/0096138 A1 | 5/2003 | Lecloux et al. | |
| 2004/0062949 A1 | 4/2004 | Pfeiffer et al. | |
| 2004/0085016 A1 | 5/2004 | Parthasarathy et al. | |
| 2004/0197601 A1 | 10/2004 | Thompson et al. | |
| 2004/0207318 A1* | 10/2004 | Lee et al. ...................... | 313/506 |
| 2005/0072970 A1 | 4/2005 | Saito | |
| 2006/0063031 A1 | 3/2006 | Brown et al. | |
| 2007/0092756 A1* | 4/2007 | Begley et al. ................. | 428/690 |
| 2007/0145355 A1 | 6/2007 | Werner et al. | |
| 2007/0252521 A1* | 11/2007 | Kondakov et al. ............ | 313/506 |
| 2008/0199727 A1 | 8/2008 | Kathirgamanathan et al. | |

FOREIGN PATENT DOCUMENTS

| | | |
|---|---|---|
| EP | 0 891 121 | 1/1999 |
| EP | 1 029 909 | 8/2000 |
| EP | 1 265 298 | 12/2002 |
| EP | 1 144 543 | 3/2004 |
| EP | 1 215 739 | 3/2007 |
| GB | 614847 | 12/1948 |
| JP | 06 145146 | 5/1994 |
| JP | 2004-319424 | 11/2004 |
| WO | 98/58037 | 12/1998 |
| WO | 00/32717 | 6/2000 |
| WO | 00/60669 | 10/2000 |
| WO | WO 02/075820 | 9/2002 |

(Continued)

OTHER PUBLICATIONS

Schmitz et al. "Lithium-Quinolate Complexes as Emitter and Interface Materials in Organic Light-Emitting Diodes" Chem. Mater., v. 12, n. 10, Oct. 2000, pp. 3012-3019.

Begley et al. "Hexakis (m-quinolin-8-olato)hexalithium(I): a Centrosymmetric Doubly Stacked Trimer" ACTA Crystallogr. Sec. E, Struc. Rep., v. 62, n. 6,4' Jun. 2006, pp. M1200-2.

(Continued)

Primary Examiner — Marie R. Yamnitzky
(74) Attorney, Agent, or Firm — Andover-IP-Law; David Silverstein

(57) ABSTRACT

Electroluminescent devices are disclosed comprising a transparent anode; a layer of a hole transporting material; a layer of an electroluminescent material; a layer of an electron transporting material; a layer of a substituted lithium quinolate; and a metal cathode. The electroluminescent device may be an organic light-emitting diode having a cathode, an electron injection layer in contact with the cathode and an electron transport layer in contact with the electron injection layer and comprising aluminum, zirconium or hafnium quinolate or a mixture thereof or a mixture of any of them with a quinolate of a metal of group 1, 2, 3, 13 or 14 of the periodic table. Such devices may be made by the steps of forming a substituted lithium quinolate having one or more substituents and depositing the substituted lithium quinolate on a cathode of the device to provide an electron injection layer.

25 Claims, 13 Drawing Sheets

(56) References Cited

FOREIGN PATENT DOCUMENTS

| WO | WO 03/080758 | 10/2003 |
| WO | 2004/058913 | 7/2004 |
| WO | 2005/080526 | 9/2005 |
| WO | WO 2005/121274 A1 * | 12/2005 |
| WO | 2006/003408 | 1/2006 |
| WO | 2006/016193 | 2/2006 |
| WO | 2006/024878 | 3/2006 |
| WO | 2006/048635 | 5/2006 |
| WO | WO 2006/048679 | 5/2006 |
| WO | 2006/061593 | 6/2006 |
| WO | 2006/087521 | 8/2006 |

OTHER PUBLICATIONS

Chen et al. "Blue Emission from Light-Emitting Diodes Based on Lithium Complex" J. Physics D.: Applied Physics, v. 35, n. 11, May 2002, pp. 1099-1102.

Rajeswaran et al. "Steric Effects of Substituted Quinolines on Lithium Coordination Geometry" Polyhedron, v. 26, n. 14, Aug. 2007, pp. 3653-3660.

Li et al. "Investigation of novel efficient electron injection lithium complex . . ." Japanese J. of Applied Physics, v. 45, n. 47, Dec. 2006, pp. L1253-L1255.

Hung et al., "Recent Progress of Molecular Organic Electroluminescent Materials and Devices", Materials Science and Engineering R 39 (2002) 143-222.

Kulkarni et al., "Electron Transport Materials for Organic Light-Emitting Diodes", Chem. Mater. (2004) 16, 4556-4573.

Cox, R.J., "Photographic Sensitivity", Academic Press (1973) Chapter 15., pp. 241-263.

Gutman et al., "Organic Semiconductors" Wiley (1967) Chapter 5., pp. 273-330.

Rajeswaran, et al., Steric Effects of Substituted Quinolines on Lithium Coordination Geometry, Polyhedron, vol. 26, 2007, pp. 3653-3660.

Li, et al., Investigation of Novel Efficient Electron Injection Lithium Complex Containing Quinoxaline Moiety for Organic Light-Emitting Diodes, Japanese Journal of Applied Physics, vol. 45, No. 47, 2006, pp. L1253-L1255.

* cited by examiner

Evaporation Rate vs. Temperature Profiles in Solciet

Liq vs. LiF as an EI

Liq vs. LiF as an EI

Fluorescent Blue Device
ITO/ZnTpTP (20)/α-NPB (65)/Compound H:Compound A (25:0.5)/Zrq$_4$ (20)/EI (0.3)/Al Fluorescent Green Device
ITO/ZnTpTP (20)/α-NPB (50)/Alq$_3$:DPQA (40:0.1)/Zrq$_4$ (20)/EI/Al

CATHODE COATING

FIELD OF THE INVENTION

The present invention relates to an electroluminescent device having an improved electron injection layer.

BACKGROUND TO THE INVENTION

U.S. Pat. No. 5,925,472 (Hu et al., Xerox Corporation) discloses inter alia an organic electroluminescent device comprising in the following sequence a substrate, an anode, a hole injection layer, a hole transport layer, an electron transport layer, a so-called "electron injection layer", and a cathode in contact with the electron injection layer. The so-called electron injection layer may be comprised of a metal oxinoid compound, e.g. tris-(8-hydroxyquinolinate)-aluminum, or bis-(8-quinolinethiolato)-zinc. The cathodes exemplified are of MgAg. Cathodes of lithium alloyed with other high work function metals such as aluminium or indium are disclosed but not exemplified. The use of aluminium cathodes is neither disclosed nor suggested. It is not apparent that the disclosed layers are true electron transport layers which should be very thin, in the case of organic materials not more than 10 nm and preferably less than 7 nm. The range of thicknesses disclosed by Hu et al. for their so-called electron transport layer is 5-80 nm. In the examples the deposited films are of thickness 80 nm and 30 nm, and these films are identified as electron transport layers rather than electron injection layers. Devices at a constant current of 25 ma/m$^2$ gave initial light outputs of 350-450 cd/m$^2$ and reduction in light output to 50% of initial intensity over periods of 150-210 hours of continuous operation, so that the effective life of the disclosed devices is short.

Hung et al., "Recent progress of molecular organic electroluminescent materials and devices", *Materials Science and Engineering*, R 39 (2002), 143-222 disclose that bilayer cathodes for OLEDs based e.g. on a thin (0.1-1.0 nm) LiF layer between an aluminium cathode and an aluminium quinolate electron transport layer exhibit significantly improved I-V characteristics and EL efficiencies compared to a MgAg cathode, see also U.S. Pat. No. 5,776,622 (Hung et al., Kodak). In a comparison of current/voltage characteristics of three OLEDs using Al, MgAg and Lif/Al as cathodes, the OLED with the Al cathode required higher drive voltages than that with MgAg, whereas that using Al/LiF required lower drive voltages. Hung et al explain that in OLEDs, the majority carriers are holes owing to their higher mobility and smaller injection barrier. Therefore, lowering the barrier height to electron injection is especially important as it leads to a better balance of electron and hole currents and results in a dramatic increase in luminance at a fixed bias voltage. The replacement of LiF with CsF or alkaline earth fluorides is also discussed.

U.S. Pat. No. 6,558,817 (Ueda et al., Minolta) provides a general disclosure of the use of alkali metal and alkaline earth salts and complexes to form electron injection layers in electroluminescent devices. A list of 100 representative compounds said to be useful as electron injectors is given, amongst which is lithium quinolate is mentioned. Acetylacetonates are said to be preferred, but the present applicants have found that the use of these materials gives rise to sensitivity to moisture, processing difficulties, poor device lifetimes and relatively large drift voltages. Useful cathode materials are said to include aluminium, indium, magnesium, calcium, titanium, yttrium, lithium, gadolinium, ytterbium, ruthenium, manganese and alloys thereof. The preparation of lithium quinolates with suitable purities and properties is not described, lithium quinolate is not used in any of the examples, there is no disclosure or suggestion of the combination of an aluminium cathode and a lithium quinolate or substituted quinolate electron injection layer, and there is no discussion of the problem of finding a combination of materials with better overall properties than Al/LiF. The exemplified OLEDs are claimed to exhibit stable luminescence over a long service life, but this is supported by measurements of light output over a period of only five hours, times to reduction in light output of 50% of initial intensity are not quoted, and in truth the lifetimes of the exemplified devices are short.

U.S. Pat. No. 6,885,149 (Parthasarathy et al., Princeton University) discloses that during fabrication of an OLED, an organic electron injection layer may be doped with a metal either by depositing an organic electron injection layer on an ultra-thin layer of lithium or by depositing an ultra-thin layer of lithium on an organic electron injection layer, the organic material being e.g. 2,9-dimethyl-4,7-diphenyl-1,10-phenanthroline (BCP or bathocuproine), see also US 2004/0085016 (Parthasarathy et al.). Use of a metal doped electron injection layer is also known in the art wherein, for example, the organic component of the electron injection layer being e.g. is the compound shown below:

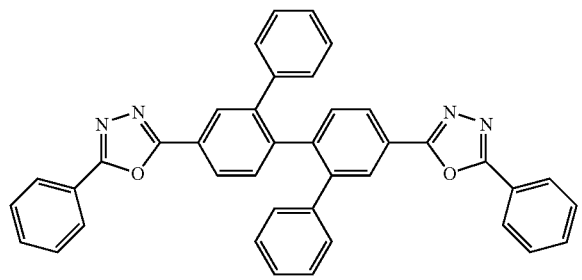 [SMILES: c1ccc(-c2nnc(-c3ccc(-c4ccc(-c5nnc(-c6ccccc6)o5)cc4-c4ccccc4)c(-c4ccccc4)c3)o2)cc1]

SUMMARY OF THE INVENTION

Figure 1:
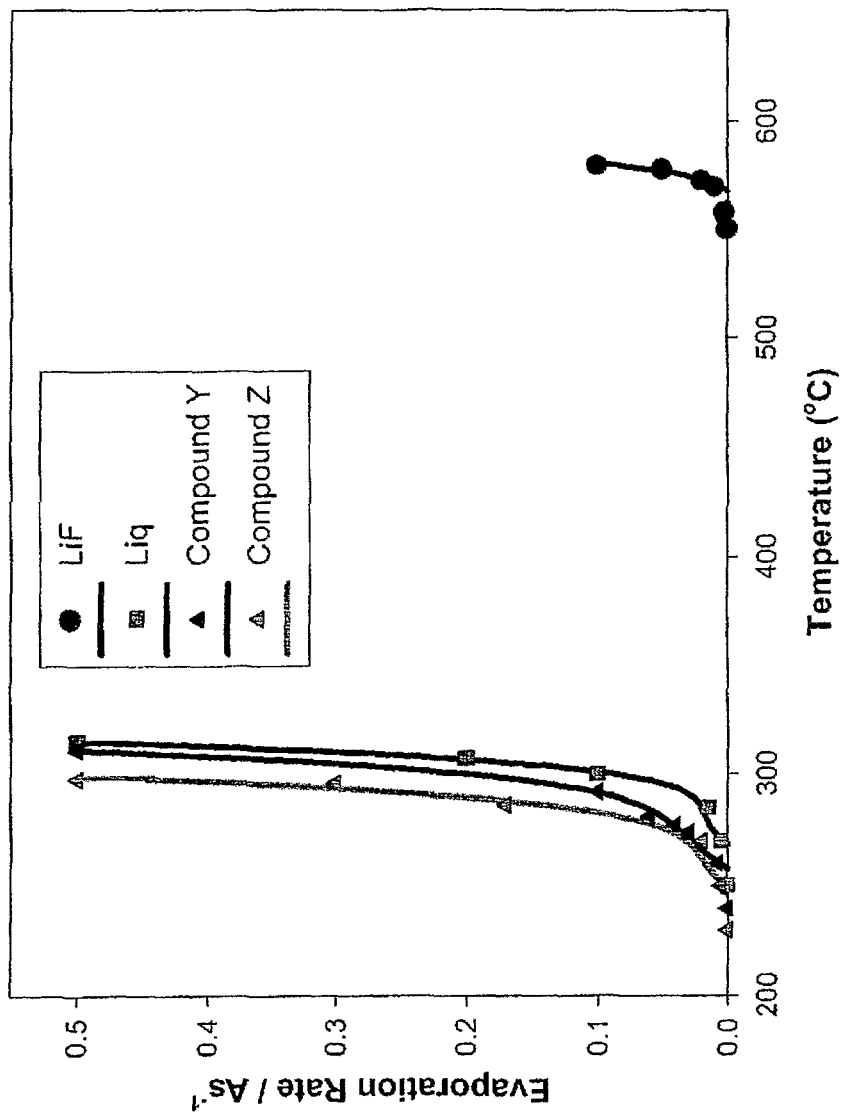
FIG. 1 is a graph of evaporation rates as a function of temperature for lithium fluoride, lithium quinolate and compounds Y and Z (as described in Example 1 hereinafter).

According to one aspect of the invention there is provided an organic light-emitting diode having a cathode, an electron injection layer in contact with the cathode and an electron transport layer in contact with the electron injection layer and comprising aluminium, zirconium or hafnium quinolate or a mixture thereof or a mixture of any of them with a quinolate of a metal of group 1, 2, 3, 13 or 14 of the periodic table, wherein the electron injection layer comprises lithium quinolate or a substituted lithium quinolate having one or more substituents selected from $C_1$-$C_4$ alkyl, monocyclic aryl or aralk-($C_1$-$C_4$)-yl, aryloxy or fluoro subject to the proviso that not more than one substituent is $C_2$-$C_4$ alkyl, aralkyl or aryloxy or an oligomer of said quinolate, and wherein the electrode is of aluminium.

Lithium quinolate is a low temperature direct replacement for lithium fluoride (LiF), the material typically used by OLED display manufactures as the electron injection layer within an OLED display. Low temperature OLED materials reduce the cost of manufacture and reduce potential damage to underlying layers of the display, thereby improving the lifetime of the OLED device. They enable display manufacturers to improve the efficiency and lifetime of an OLED display, as well as to reduce the operating voltage and to minimise voltage drift. In trials using lithium quinolate as a direct replacement for lithium fluoride in red, green and blue displays current efficiency has improved by up to nine percent, power efficiency has improved by as much as 15%, the lifetime of the display has increased by up to 12% and voltage drift has been reduced by up to 61%. Lithium quinolate evaporates at 295° C. as compared to lithium fluoride which requires a temperature over 580° C., making the deposition faster, reducing energy consumption and introducing the potential of using plastic as a substrate. The reduced manufacturing temperature also eliminates the need for costly evaporation crucibles reducing the overall cost of manufacture. Lithium quinolate can be handled in air, and in situ mass spectroscopy on extended thermal evaporation has confirmed its high stability insofar as there has been no appearance of decomposition peaks. It has been found that substituted lithium quinolates have similar properties.

In an alternative aspect, the invention provides a method of making an electroluminescent device, which comprises forming lithium quinolate or a substituted lithium quinolate having one or more substituents selected from $C_1$-$C_4$ alkyl, monocyclic aryl or aralk-($C_1$-$C_4$)-yl, aryloxy or fluoro subject to the proviso that not more than one substituent is $C_2$-$C_4$ alkyl, aralkyl or aryloxy by reacting a lithium alkyl or alkoxide with 8-hydroxyquinoline or a derivative thereof in a solvent comprising acetonitrile, and depositing lithium quinolate or a substituted lithium quinolate formed as described above on a cathode of the device e.g. an aluminium cathode to provide an electron injection layer.

The use of acetonitrile as solvent during synthesis of the lithium quinolate or substituted quinolate (see EP-B-1144543, the disclosure of which is incorporated herein by reference) provides these compounds in forms which are readily purified by repeated sublimation and have advantageous electrical and other properties. It is believed (although the effectiveness of the invention does not depend on this belief) that acetonitrile used as a solvent or component thereof promotes the formation of oligomers which give rise to the observed advantageous properties.

In a further aspect there is provided an OLED or other electroluminescent device having a cathode formed with electron injection and electron transport layers thereon, wherein the electron injection layer comprises an oligomer of lithium quinolate or a substituted lithium quinolate having one or more substituents selected from $C_1$-$C_4$ alkyl, monocyclic aryl or aralk-($C_1$-$C_4$)-yl, aryloxy or fluoro subject to the proviso that not more than one substituent is $C_2$-$C_4$ alkyl, aralkyl or aryloxy.

DESCRIPTION OF PREFERRED FEATURES

A typical device comprises a transparent substrate on which are successively formed an anode layer, a hole injector (buffer) layer, a hole transport layer, an electroluminescent layer, an electron transport layer, an electron injection layer and an a cathode layer which may in turn be laminated to a second transparent substrate. Top emitting OLEDs are also possible in which an aluminum or other metallic substrate carries an ITO layer, a hole injection layer, a hole transport layer, an electroluminescent layer, an electron transport layer, an electron injection layer, a thin layer of Mg or MgAg and an ITO or other transparent cathode, light being emitted through the cathode. A further possibility is an inverted OLED in which a cathode of aluminum or aluminum alloyed with a low work function metal carries successively an electron injection layer, an electron transport layer, an electroluminescent layer, a hole transport layer, a hole injection layer and an ITO or other transparent conductive anode, emission of light being through the anode. If desired a hole blocking layer may be inserted e.g. between the electroluminescent layer and the electron transport layer. In each case the electron injection layer is a metal quinolate or substituted quinolate or oligomer thereof.

The display of the invention may be monochromatic or polychromatic. Thus, a full color display can be formed by arranging three individual pixels, each emitting a different primary monochrome color, on different sides of an optical system, from another side of which a combined color image can be viewed. Alternatively, rare earth chelate fluorescent or phosphorescent compounds emitting different colors can be fabricated so that adjacent diode pixels in groups of three neighboring pixels produce red, green and blue light. In a further alternative, field sequential color filters can be fitted to a white light emitting display.

In some embodiments either or both electrodes can be formed of silicon and the electroluminescent material and intervening layers of a hole transporting and electron transporting materials can be formed as pixels on the silicon substrate. Preferably, the substrate is of crystalline silicon and the surface of the substrate may be polished or smoothed to produce a flat surface prior to the deposition of electrode, or electroluminescent compound. Alternatively a non-planarized silicon substrate (which may be amorphous, polycrystalline, microcrystalline or continuous grained silicon) can be coated with a layer of conducting polymer or small molecules to provide a smooth, flat surface prior to deposition of further materials.

In one embodiment, each pixel comprises a metal electrode in contact with the substrate. Depending on the relative work functions of the metal and transparent electrodes, either may serve as the anode with the other constituting the cathode.

When the silicon substrate is the cathode an indium tin oxide coated glass can act as the anode and light is emitted through the anode. When the silicon substrate acts as the anode the cathode can be formed of a transparent electrode e.g. Mg/Ag and ITO. The anode can have a transparent coating of a metal formed on it to give a suitable work function. As previously explained, these devices are sometimes referred to as top emitting devices.

The metal electrode may consist of a plurality of metal layers, for example a higher work function metal such as aluminium deposited on the substrate and a lower work function metal such as calcium deposited on the higher work function metal. In another example, a further layer of conducting polymer lies on top of a stable metal such as aluminium.

Preferably, the electrode also acts as a mirror behind each pixel and is either deposited on, or sunk into, the planarised surface of the substrate. However, there may alternatively be a light absorbing contrast-enhancing layer adjacent to the substrate.

In still another embodiment, selective regions of a bottom conducting polymer layer are made non-conducting by exposure to a suitable aqueous solution allowing formation of arrays of conducting pixel pads which serve as the bottom contacts of the pixel electrodes.

As described in WO 00/60669 the brightness of light emitted from each pixel may be controllable in an analog manner by adjusting the voltage or current applied by the matrix circuitry or by inputting a digital signal which is converted to an analogue signal in each pixel circuit. The substrate preferably also provides data drivers, data converters and scan drivers for processing information to address the array of pixels so as to create images. When an electroluminescent material is used which emits light of a different colour depending on the applied voltage the color of each pixel can be controlled by the matrix circuitry. In one embodiment, each pixel is controlled by a switch comprising a voltage controlled element and a variable resistance element, both of which are conveniently formed by metal-oxide-semiconductor field effect transistors (MOSFETs) or by an active matrix transistor.

An embodiment of an electroluminescent device of the invention is formed of:
(i) a transparent anode;
(ii) a layer of a hole-injecting material which may be neat or may be doped with an acceptor;
(iii) a layer of a hole transporting material;
(iv) a layer of an electroluminescent material;
(v) a layer of an electron transporting material which may be neat or may be doped with a donor;
(vi) a layer of a lithium quinolate of thickness less than 1 nm; and
(vii) a metal cathode.

The layer of the lithium quinolate is preferably less than 7 nm in thickness, typically 3-0.1 nm in thickness, e.g. about 0.3-0.5 nm in thickness. As the thickness of an electron injection layer increases, the efficiency decreases more sharply for LiF compared with lithium quinolate or a substituted lithium quinolate. LiF is a poorly conducting ionic solid whereas lithium quinolate and substituted lithium quinolates are much more conducting organic metal complexes. This is a useful property as the thickness control of lithium quinolate and substituted lithium quinolates is not as critical as LiF.

Anode
In many embodiments, the first electrode is a transparent substrate such as a conductive glass or plastic material which acts as the anode. Preferred substrates are glass coated with tin oxide, indium tin oxide, antimony tin oxide or indium zinc oxide-coated glass. However, any glass which is conductive or has a conductive layer such as a metal or conductive polymer can be used.

Hole Injection Materials
A single layer may be provided between the anode and the electroluminescent material, but in many embodiments there are at least two layers one of which is a hole injection layer (buffer layer) and the other of which is a hole transport layer, the two layer structure offering in some embodiments improved stability and device life (see U.S. Pat. No. 4,720,432 (VanSlyke et al., Kodak, disclosure of which is incorporated herein by reference). The hole injection layer may serve to improve the film formation properties of subsequent organic layers and to facilitate the injection of holes into the hole transport layer.

Suitable materials for the hole injection layer which may be of thickness e.g. 0.1-200 nm depending on material and cell type e.g. about 25 nm include hole-injecting porphyrinic compounds—see U.S. Pat. No. 4,356,429 (Tang, Eastman Kodak, the disclosure of which is incorporated herein by reference) e.g. zinc phthalocyanine copper phthalocyanine and ZnTpTP, whose formula is set out below:

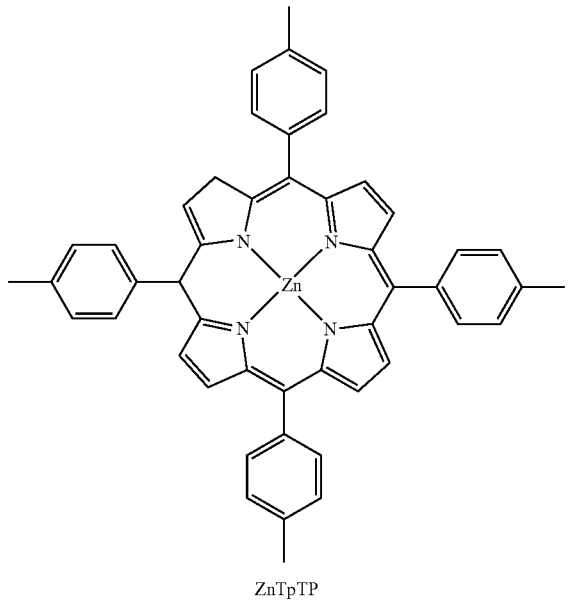

ZnTpTP

Particularly good device lifetimes may be expected where the hole injection layer is ZnTpTP and the electron transport layer is zirconium or hafnium quinolate.

The hole injection layer may also be a fluorocarbon-based conductive polymer formed by plasma polymerization of a fluorocarbon gas—see U.S. Pat. No. 6,208,075 (Hung et al; Eastman Kodak), a triarylamine polymer—see EP-A-0891121 (Inoue et al., TDK Corporation) or a phenylenediamine derivative—see EP-A-1029909 (Kawamura et al., Idemitsu), the disclosures of which are incorporated herein by reference.

Hole-Transport Materials
Hole transport layers which may be used are preferably of thickness 20 to 200 nm and may be doped to increase carrier mobility and reduce operating voltage.

One class of hole transport materials comprises polymeric materials that may be deposited as a layer by means of spin coating or ink jet printing. Such polymeric hole-transporting materials include poly(N-vinylcarbazole) (PVK), polythiophenes, polypyrrole, and polyaniline. Other hole transporting materials are conjugated polymers e.g. poly (p-phenylenevinylene) (PPV) and copolymers including PPV. Other preferred polymers are: poly(2,5 dialkoxyphenylene vinylenes) e.g. poly (2-methoxy-5-(2-methoxypentyloxy-1,4-phenylene vinylene), poly(2-methoxypentyloxy)-1,4-phenylenevinylene), poly(2-methoxy-5-(2-dodecyloxy-1,4-phenylenevinylene) and other poly(2,5 dialkoxyphenylenevinylenes) with at least one of the alkoxy groups being a long chain solubilising alkoxy group; polyfluorenes and oligofluorenes; polyphenylenes and oligophenylenes; polyanthracenes and oligo anthracenes; and polythiophenes and oligothiophenes.

A further class of hole transport materials comprises sublimable small molecules. For example, aromatic tertiary amines provide a class of preferred hole-transport materials, e.g. aromatic tertiary amines including at least two aromatic tertiary amine moieties (e.g. those based on biphenyl diamine or those of a "starburst" configuration), of which the following are representative:

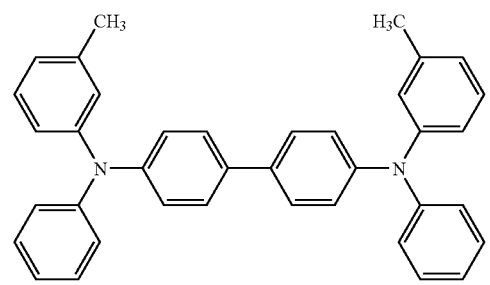

TPD
Tg (° C.) 61
$\mu h$ (cm$^2$ V$^{-1}$ s$^{-1}$) $1 \times 10^{-3}$

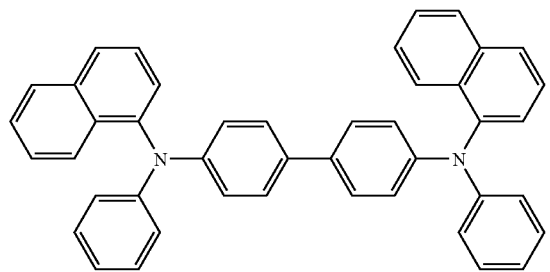

α-NBP
Tg (° C.) 98
$\mu h$ (cm$^2$ V$^{-1}$ s$^{-1}$) $1 \times 10^{-4}$

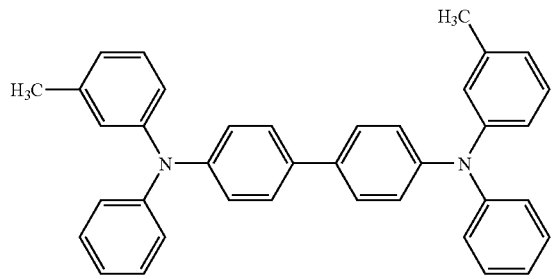

CBP

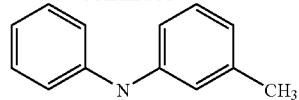

-continued m-MTDATA.
Tg (° C.) 75
$\mu h$ (cm$^2$ V$^{-1}$ s$^{-1}$) $2.7 \times 10^{-5}$ It further includes spiro-linked molecules which are aromatic amines e.g. spiro-TAD (2,2',7,7'-tetrakis-(diphenylamino)-spiro-9,9'-bifluorene).

A further class of small molecule hole transport materials is disclosed in WO 2006/061594 (Kathirgamanathan et al., the disclosure of which is incorporated herein by reference) and is based on diamino dainthracenes e.g. of formula

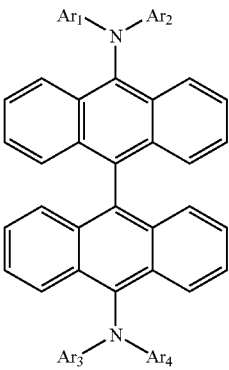

wherein Ar$_1$-Ar$_4$ which may be the same or different may be phenyl, biphenyl, naphthyl or

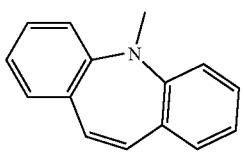 [SMILES: CN1c2ccccc2C=Cc2ccccc21]

which may optionally be substituted by C$_1$-C$_4$ alkyl e.g. methyl or C$_1$-C$_4$ alkoxy e.g. methoxy. Typical compounds include:
9-(10-(N-(naphthalen-1-yl)-N-phenylamino)anthracen-9-yl)-N-(naphthalen-1-yl)-N-phenylanthracen-10-amine (Compound Y in the Examples);
9-(10-(N-biphenyl-N-2-m-tolylamino)anthracen-9-yl)-N-biphenyl-N-2-m-tolylamino-anthracen-10-amine; and 9-(10-(N-phenyl-N-m-tolylamino)anthracen-9-yl)-N-phenyl-N-m-tolylanthracen-10-amine.

Acceptor or p-type doping of the hole transport layer is discussed in US 2004/0062949 (Pfeiffer et al., the disclosure of which is incorporated herein by reference) and in US 2007/0145355 (Werner et al., the disclosure of which is incorporated herein by reference). Examples of acceptors include tetracyano-quinodimethane (TCNQ), tetrafluoro-tetracyano-quinodimethane ($F_4$-TCNQ) and acridine derivatives e.g. 3,6-bis-(dimethylamino)-acridine.

Electroluminescent Materials

In principle any electroluminescent material may be used, including molecular solids which may be fluorescent dyes e.g. perylene dyes, metal complexes e.g. $Alq_3$, $Ir(III)L_3$, rare earth chelates e.g. Tb(III) complexes, dendrimers and oligomers e.g. sexithiophene, or polymeric emissive materials. The electroluminescent layer may comprise as luminescent material a metal quinolate, iridium, ruthenium, osmium, rhodium, iridium, palladium or platinum complex, a boron complex or a rare earth complex. Mixtures thereof may also be used.

One preferred class of electroluminescent materials comprises host materials doped with dyes which may be fluorescent, phosphorescent or ion-phosphorescent (rare earth). The term "electroluminescent device" includes electrophosphorescent devices.

A compound as described above may be doped with dyes such as fluorescent laser dyes, luminescent laser dyes to modify the color spectrum of the emitted light and/or to and also enhance the photoluminescent and electroluminescent efficiencies. The compound can also be mixed with a polymeric material such as a polyolefin e.g. polyethylene, polypropylene etc. and preferably polystyrene. It may also be mixed with a conjugated polymer e.g. a polyfluorene to impart conductivity and/or electroluminescent and/or fluorescent properties.

Preferably the compound is doped with a minor amount of a fluorescent or phosphorescent material as a dopant, preferably in an amount of 0.01 to 25% by weight of the doped mixture. The dopant is more preferably present in the compound in an amount of 0.01% to 10% by weight e.g. in an amount of 0.01% to 5%.

The doped compound can be deposited on a substrate by any conventional method, e.g.

(a) Directly by vacuum evaporation of a mixture of the compound and dopant.

(b) Evaporation from a solution in an organic solvent or co evaporation of the compound and dopant. The solvent which is used will depend on the material but chlorinated hydrocarbons such as dichloromethane and n-methyl pyrrolidone; dimethyl sulfoxide; tetrahydrofuran; dimethylformamide etc. are suitable in many cases.

(c) Spin coating of the compound and dopant from solution.

(d) Sputtering.

(e) Melt deposition.

(f) Ink jet printing.

As discussed in U.S. Pat. No. 4,769,292 (Tang et al., Kodak, the contents of which are included by reference) the presence of the fluorescent material permits a choice from amongst a wide latitude of wavelengths of light emission. In particular, as disclosed in U.S. Pat. No. 4,769,292 by blending with the organometallic complex a minor amount of a fluorescent material capable of emitting light in response to hole-electron recombination, the hue of the light emitted from the luminescent zone, can be modified. In theory, if a host material and a fluorescent material could be found for blending which have exactly the same affinity for hole-electron recombination, each material should emit light upon injection of holes and electrons in the luminescent zone. The perceived hue of light emission would be the visual integration of both emissions. However, since imposing such a balance of host material and fluorescent materials is limiting, it is preferred to choose the fluorescent material so that it provides the favoured sites for light emission. When only a small proportion of fluorescent material providing favoured sites for light emission is present, peak intensity wavelength emissions typical of the host material can be entirely eliminated in favour of a new peak intensity wavelength emission attributable to the fluorescent material.

While the minimum proportion of fluorescent material sufficient to achieve this effect varies, in no instance is it necessary to employ more than about 10 mole percent fluorescent material, based of host material and seldom is it necessary to employ more than 1 mole percent of the fluorescent material. On the other hand, limiting the fluorescent material present to extremely small amounts, typically less than about $10^{-3}$ mole percent, based on the host material, can result in retaining emission at wavelengths characteristic of the host material. Thus, by choosing the proportion of a fluorescent material capable of providing favoured sites for light emission, either a full or partial shifting of emission wavelengths can be realized. This allows the spectral emissions of the EL devices to be selected and balanced to suit the application to be served. In the case of fluorescent dyes, typical amounts are 0.01 to 5 wt %, for example 2-3 wt %. In the case of phosphorescent dyes typical amounts are 0.1 to 15 wt %. In the case of ion phosphorescent materials typical amounts are 0.01-25 wt % or up to 100 wt %.

Choosing fluorescent materials capable of providing favoured sites for light emission, necessarily involves relating the properties of the fluorescent material to those of the host material. The host can be viewed as a collector for injected holes and electrons with the fluorescent material providing the molecular sites for light emission. One important relationship for choosing a fluorescent material capable of modifying the hue of light emission when present in the host is a comparison of the reduction potentials of the two materials. The fluorescent materials demonstrated to shift the wavelength of light emission have exhibited a less negative reduction potential than that of the host. Reduction potentials, measured in electron volts, have been widely reported in the literature along with varied techniques for their measurement. Since it is a comparison of reduction potentials rather than their absolute values which is desired, it is apparent that any accepted technique for reduction potential measurement can be employed, provided both the fluorescent and host reduction potentials are similarly measured. A preferred oxidation and reduction potential measurement techniques is reported by R. J. Cox, *Photographic Sensitivity, Academic Press*, 1973, Chapter 15.

A second important relationship for choosing a fluorescent material capable of modifying the hue of light emission when present in the host is a comparison of the band-gap potentials of the two materials. The fluorescent materials demonstrated to shift the wavelength of light emission have exhibited a lower band gap potential than that of the host. The band gap potential of a molecule is taken as the potential difference in electron volts (eV) separating its ground state and first singlet state. Band gap potentials and techniques for their measurement have been widely reported in the literature. The band gap potentials herein reported are those measured in electron volts (eV) at an absorption wavelength which is bathochromic to the absorption peak and of a magnitude one tenth that of the magnitude of the absorption peak. Since it is a comparison of band gap potentials rather than their absolute values which is desired, it is apparent that any accepted technique for band gap measurement can be employed, provided both the fluorescent and host band gaps are similarly measured. One illustrative measurement technique is disclosed by F. Gutman and L. E. Lyons, *Organic Semiconductors*, Wiley, 1967, Chapter 5.

With host materials which are themselves capable of emitting light in the absence of the fluorescent material, it has been observed that suppression of light emission at the wavelengths of emission characteristics of the host alone and enhancement of emission at wavelengths characteristic of the fluorescent material occurs when spectral coupling of the host and fluorescent material is achieved. By "spectral coupling" it is meant that an overlap exists between the wavelengths of emission characteristic of the host alone and the wavelengths of light absorption of the fluorescent material in the absence of the host. Optimal spectral coupling occurs when the emission wavelength of the host is within ±25 nm of the maximum absorption of the fluorescent material alone. In practice advantageous spectral coupling can occur with peak emission and absorption wavelengths differing by up to 100 nm or more, depending on the width of the peaks and their hypsochromic and bathochromic slopes. Where less than optimum spectral coupling between the host and fluorescent materials is contemplated, a bathochromic as compared to a hypsochromic displacement of the fluorescent material produces more efficient results.

Useful fluorescent materials are those capable of being blended with the host and fabricated into thin films satisfying the thickness ranges described above forming the luminescent zones of the EL devices of this invention. While crystalline organometallic complexes do not lend themselves to thin film formation, the limited amounts of fluorescent materials present in the host permit the use of fluorescent materials which are alone incapable of thin film formation. Preferred fluorescent materials are those which form a common phase with the host. Fluorescent dyes constitute a preferred class of fluorescent materials, since dyes lend themselves to molecular level distribution in the host. Although any convenient technique for dispersing the fluorescent dyes in the host can be used preferred fluorescent dyes are those which can be vacuum vapour deposited along with the host materials.

One class of host materials comprises metal complexes e.g. metal quinolates such as lithium quinolate, aluminium quinolate, titanium quinolate, zirconium quinolate or hafnium quinolate which may be doped with fluorescent materials or dyes as disclosed in patent application WO 2004/058913. Another class of host materials comprises sublimable polyaromatic small molecules.

Fluorescent laser dyes are recognized to be particularly useful fluorescent materials for use in the organic EL devices of this invention. Dopants which can be used include diphenylacridine, coumarins, perylene and their derivatives. Useful fluorescent dopants are disclosed in U.S. Pat. No. 4,769,292.

One class of preferred dopants is coumarins e.g. those of the formula:

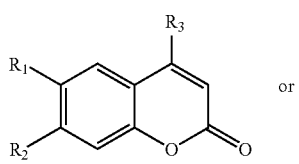

or

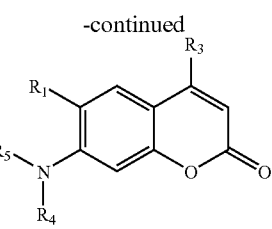

wherein $R_1$-$R_5$ represent hydrogen or alkyl e.g. methyl or ethyl. Compounds of this type include 7-hydroxy-2H-chromen-2-one, 7-hydroxy-2-oxo-2H-chromene-3-carbonitrile, 7-hydroxy-4-methyl-2-oxo-2H-chromene-3-carbonitrile, 7-(ethylamino)-4,6-dimethyl-2H-chromen-2-one, 7-amino-4-methyl-2H-chromen-2-one, 7-(diethylamino)-4-methyl-2H-chromen-2-one, 7-hydroxy-4-methyl-2H-chromen-2-one, 7-(dimethylamino)-4-(trifluoromethyl)-2H-chromen-2-one, and 7-(dimethylamino)-2,3-dihydrocyclopenta[c]chromen-4(1H)-one. In addition the following dyes may be used:

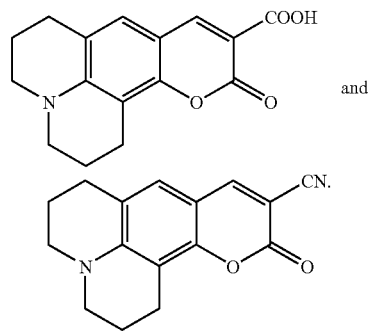

Further dopants that may be used include 3-(benzo[d]thiazol-2-yl)-8-(diethylamino)-2H-benzo[g]chromen-2-one, 3-(1H-benzo[d]imidazol-2-yl)-8-(diethylamino)-2H-benzo[g]chromen-2-one, 9-(pentan-3-yl)-1H-benzo[a]phenoxazin-5(4H,7aH,12aH)-one and 10-(2-benzothiazolyl)-1,1,7,7-tetramethyl-2,3,6,7-tetrahydro-1H,5H,11H-[1]benzopyrano[6,7,8-ij]quinolizin-11-one (C-545-T) of formula below and analogs such as C-545TB and C545MT:

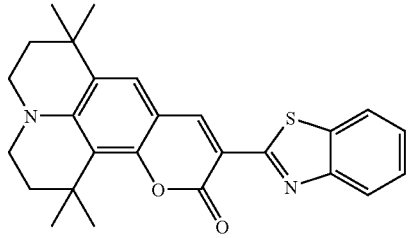

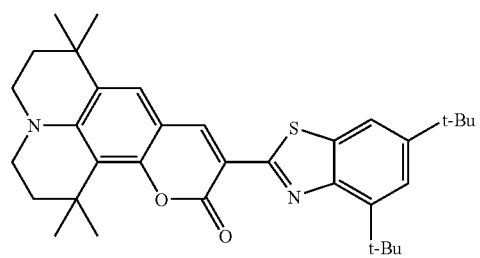

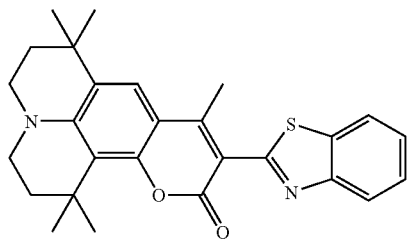

C545MT

Further dopants that can be used include pyrene and perylene compounds e.g. compounds of one of the formulae below:

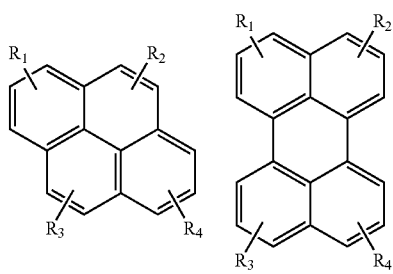

wherein $R_1$ to $R_4$ which may be the same or different are selected from hydrogen, hydrocarbyl groups, substituted and unsubstituted aromatic, heterocyclic and polycyclic ring structures, fluorocarbons e.g. trifluoromethyl, halogen e.g. fluorine or thiophenyl or can be substituted or unsubstituted fused aromatic, heterocyclic and polycyclic ring structures. Of the above compounds, preferred are compounds wherein $R_1$ to $R_4$ are selected from hydrogen and t-butyl e.g. perylene and tetrakis-t-butyl perylene which because of the steric effects of the t-butyl groups does not crystallize out of the matrix and is of formula:

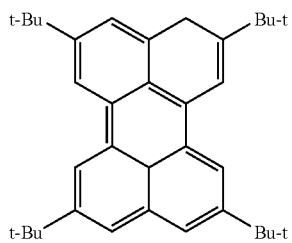

$R_1$ to $R_4$ may also be copolymerisable with a monomer e.g. styrene and may be unsaturated alkylene groups such as vinyl groups or groups —$CH_2$—CH=CH—R wherein R is hydrocarbyl, aryl, heterocyclic, carboxy, aryloxy, hydroxy, alkoxy, amino or substituted amino e.g. styryl. Compounds of this type include polycyclic aromatic hydrocarbons containing at least four fused aromatic rings and optionally one or more alkyl substituents e.g. perylene, tetrakis-(t-butyl)-perylene and 7-(9-anthryl)-dibenzo[a,o]perylene (pAAA) of structure:

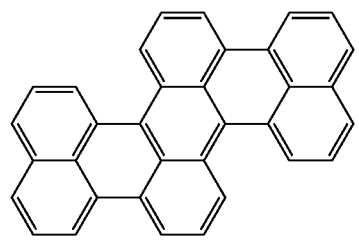 [SMILES: c1cc2cccc3c2c(c1)c1cccc2c1c3c1cccc3c4cccc5cccc(c54)c2c31]

Bis-perylene and dianthryl dopants may also be employed.

Other dopants include salts of bis benzene sulfonic acid (require deposition by spin-coating rather than sublimation) such as (C)

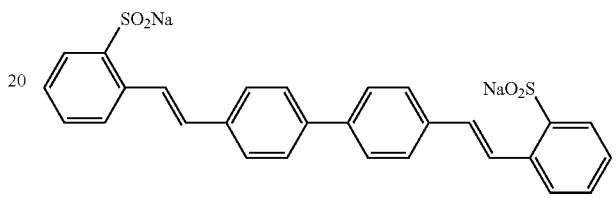

and perylene and perylene derivatives.

Various fluorescent dopants based inter alia on iridium are disclosed in WO 2005/080526, WO 2006/003408, WO 2006/016193, WO 2006/024878 and WO 2006/087521, the disclosures of which are incorporated herein by reference.

For example, the dopant may be a complex of a general formula selected from:

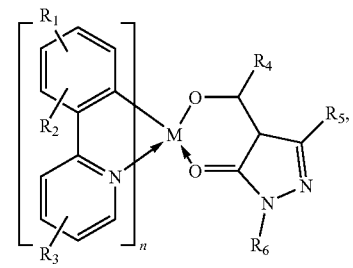

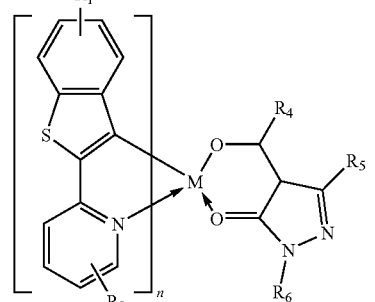

and

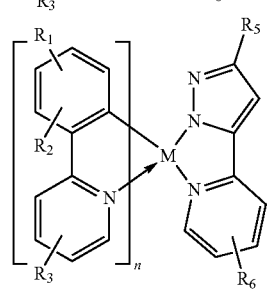

wherein

R$_1$, R$_2$, and R$_3$ which may be the same or different are selected from the group consisting of hydrogen, alkyl, trifluoromethyl or fluoro; and R$_4$, R$_5$ and R$_6$ which can be the same or different are selected from the group consisting of hydrogen, alkyl or phenyl which may be unsubstituted or may have one or more alkyl, alkoxy, trifluormethyl or fluoro substituents;

M is ruthenium, rhodium, palladium, osmium, iridium or platinum; and n is 1 or 2.

The dopant may also be a complex of a general formula selected from:

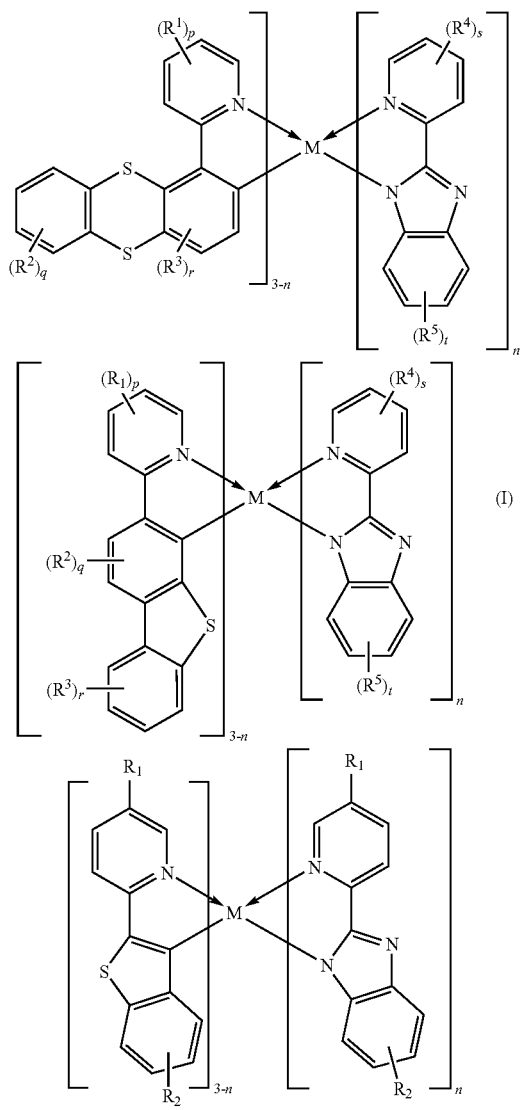

wherein

M is ruthenium, rhodium, palladium, osmium, iridium or platinum;

n is 1 or 2;

R$_1$, R$_2$, R$_3$, R$_4$ and R$_5$ which may be the same or different are selected from the group consisting of hydrogen, hydrocarbyl, hydrocarbyloxy, halogen, nitrile, amino, dialkylamino, arylamino, diarylamino and thiophenyl;

p, s and t are independently are 0, 1, 2 or 3, subject to the proviso that where any of p, s and t is 2 or 3 only one of them can be other than saturated hydrocarbyl or halogen;

q and r are independently are 0, 1 or 2, subject to the proviso that when q or r is 2, only one of them can be other than saturated hydrocarbyl or halogen.

In embodiments, for the compounds described above:

(a) Compounds of the formula below can serve as red dopants:

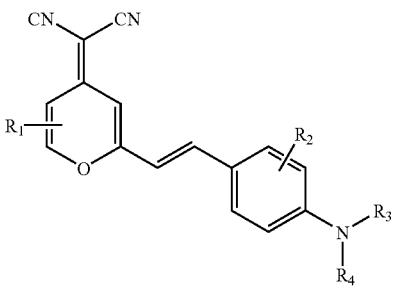

wherein R$_1$ represents alkyl e.g. methyl, ethyl or t-butyl, R$_2$ represents hydrogen or alkyl e.g. methyl, ethyl or t-butyl and R$_3$ and R$_4$ represent hydrogen, alkyl e.g. methyl or ethyl or C$_6$ ring structures fused to one another and to the phenyl ring at the 3- and 5-positions and optionally further substituted with one or two alkyl e.g. methyl groups. Examples of such compounds include

DCM

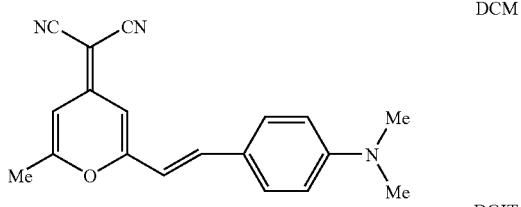

DCJT

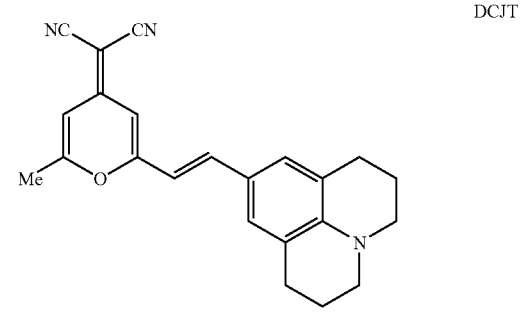

DCJTB

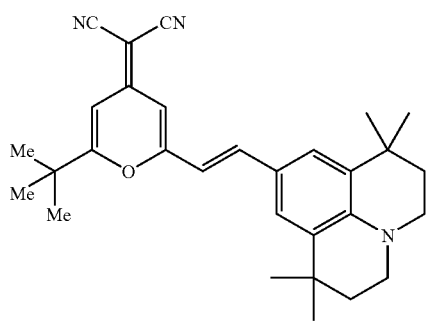

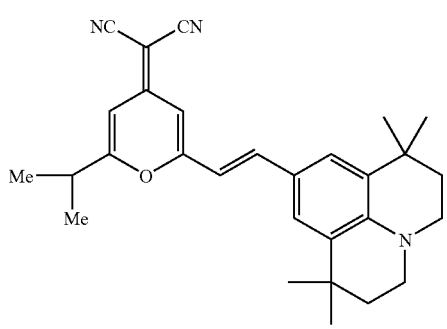
DCJTi
Particular phosphorescent materials that can be used as red dopants (see WO 2005/080526, the disclosure of which is incorporated herein by reference) include the following:
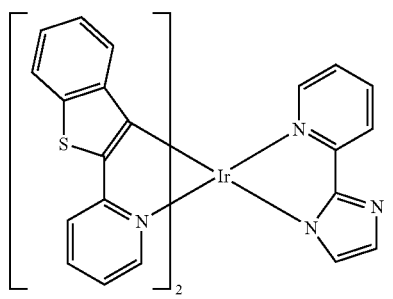
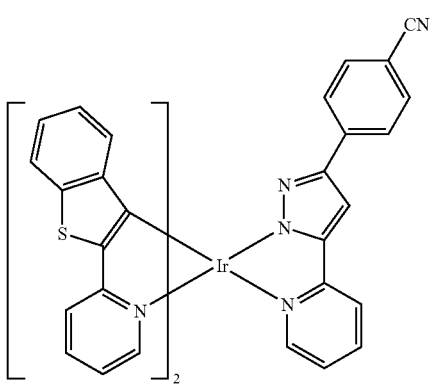
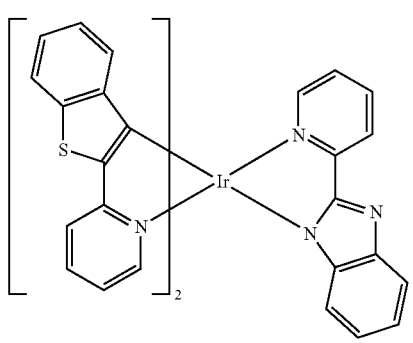
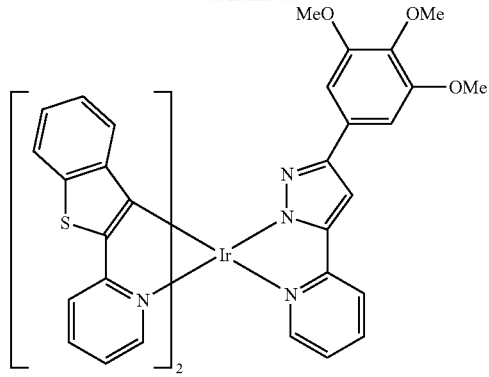
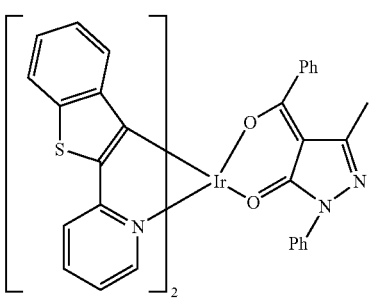
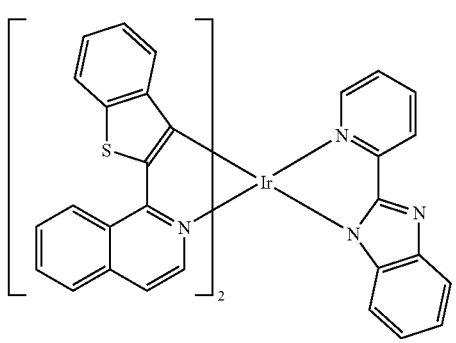
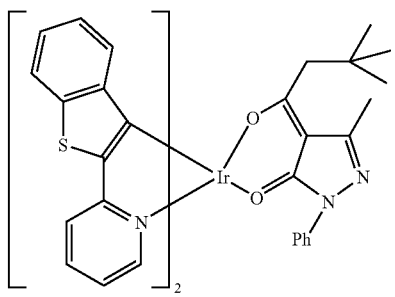
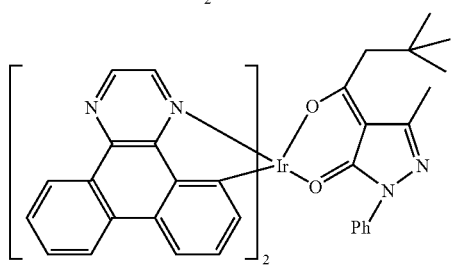
(b) The compounds below, for example, can serve as green dopants:

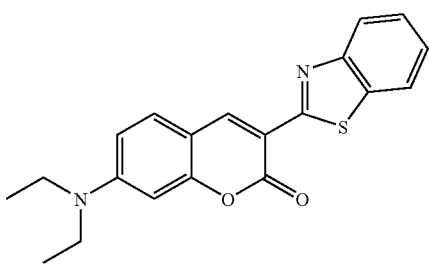

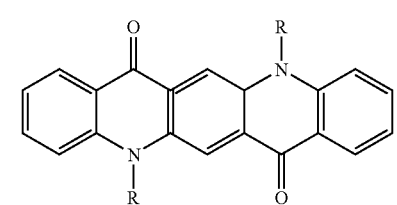

wherein R is $C_1$-$C_4$ alkyl, monocyclic aryl, bicyclic aryl, monocyclic heteroaryl, bicyclic heteroaryl, aralkyl or thienyl, preferably phenyl.

Further phosphorescent compounds that can be used as green dopants include the following compounds (see WO 2005/080526):

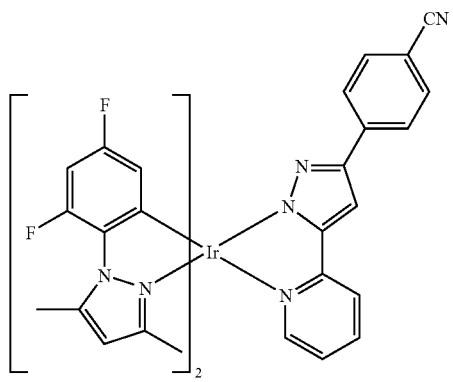

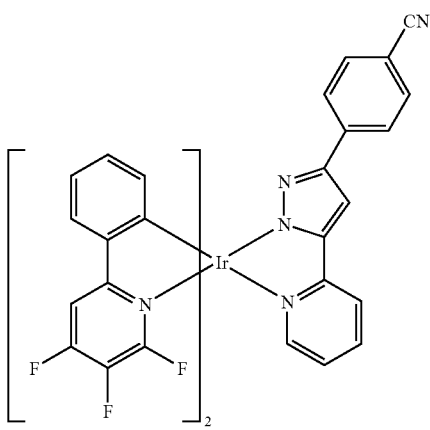

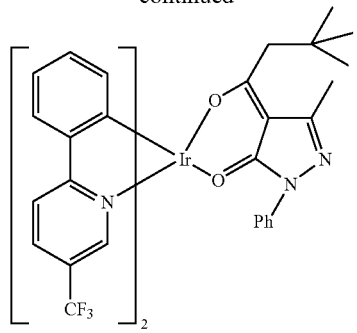

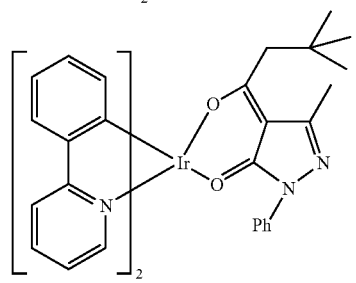

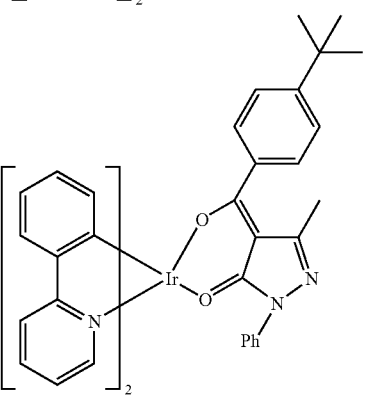

(c) The compounds perylene and 9-(10-(N-(naphthalen-8-yl)-N-phenylamino)anthracen-9-yl)-N-(naphthalen-8-yl)-N-phenylanthracen-10-amine can serve as a blue dopants.

Yet further possible dopants comprise aromatic tertiary amines including at least two aromatic tertiary amine moieties (e.g. those based on biphenyl diamine or of a "starburst" configuration) as described above as hole transport materials.

Other dopants are dyes such as the fluorescent 4-dicyanomethylene-4H-pyrans and 4-dicyanomethylene-4H-thiopyrans, e.g. the fluorescent dicyanomethylenepyran and thiopyran dyes. Useful fluorescent dyes can also be selected from among known polymethine dyes, which include the cyanines, complex cyanines and merocyanines (i.e. tri-, tetra- and poly-nuclear cyanines and merocyanines), oxonols, hemioxonols, styryls, merostyryls, and streptocyanines. The cyanine dyes include, joined by a methine linkage, two basic heterocyclic nuclei, such as azolium or azinium nuclei, for example, those derived from pyridinium, quinolinium, isoquinolinium, oxazolium, thiazolium, selenazolium, indazolium, pyrazolium, pyrrolium, indolium, 3H-indolium, imidazolium, oxadiazolium, thiadioxazolium, benzoxazolium, benzothiazolium, benzoselenazolium, benzotellurazolium, benzimidazolium, 3H- or 1H-benzoindolium, naphthoxazolium, naphthothiazolium, naphthoselenazolium, naphthotellurazolium, carbazolium, pyrrolopyridinium, phenanthrothiazolium, and acenaphthothiazolium quaternary salts. Other useful classes of fluorescent dyes are 4-oxo-4H-benz-

[d,e]anthracenes and pyrylium, thiapyrylium, selenapyrylium, and telluropyrylium dyes.
Yet further phosphorescent dopants (see WO 2005/080526) include the following compounds:
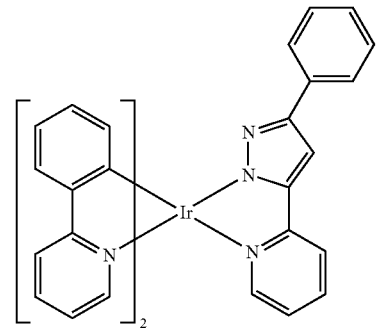
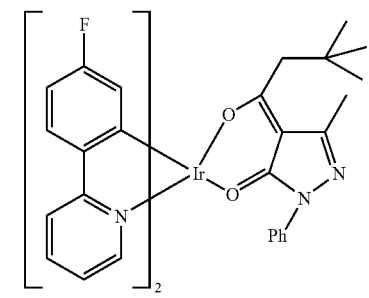
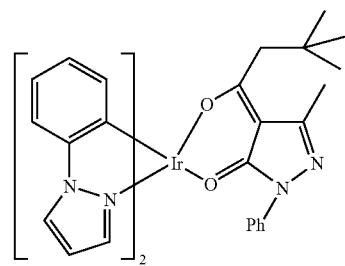
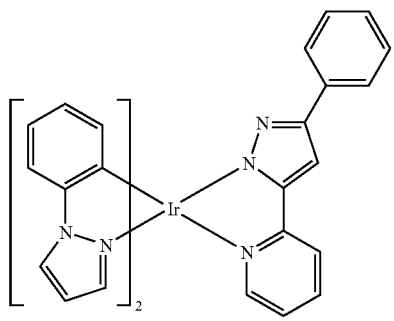
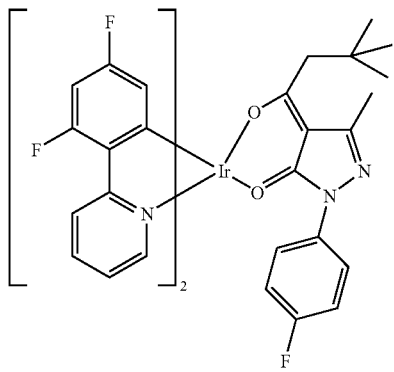
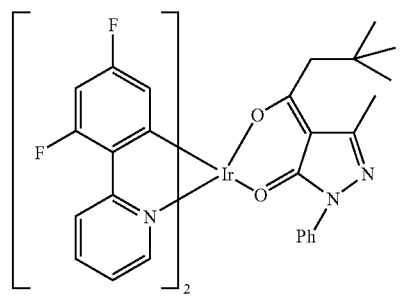
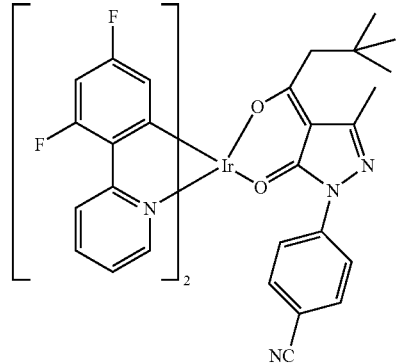
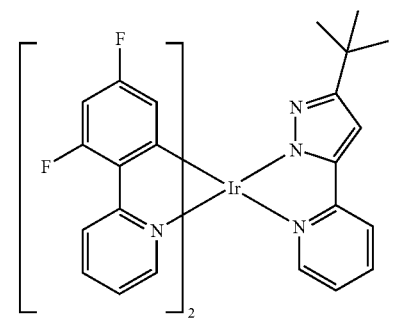
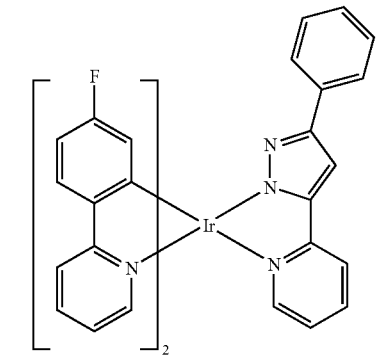
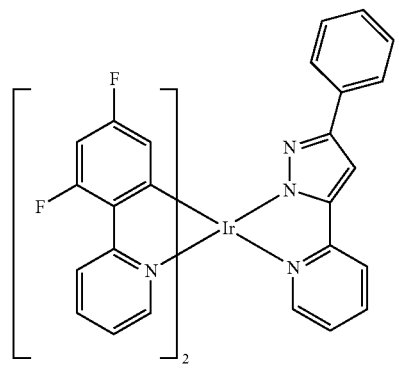

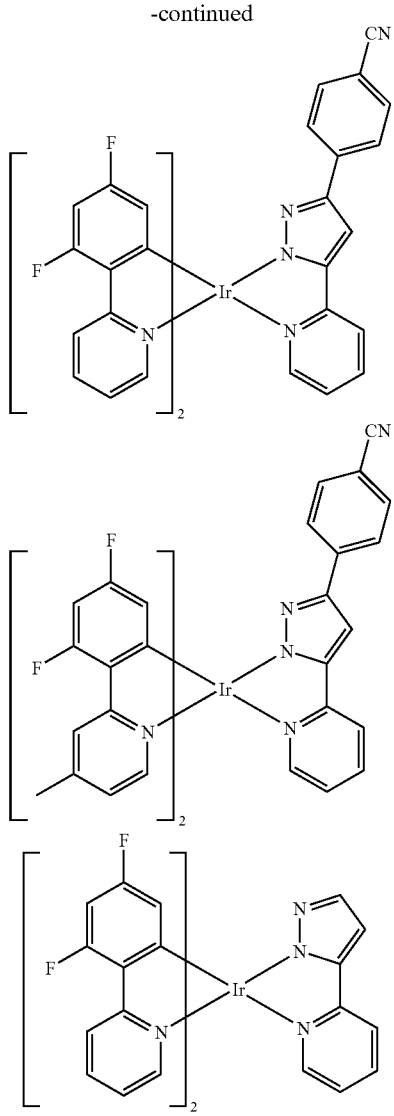

Rare earth chelates are yet further possible dopants, e.g. of the formula $(L\alpha)_n M$ or $(L\alpha)n>M\leftarrow Lp$ where $L\alpha$ and $Lp$ are organic ligands, M is a rare earth metal and n is the valence of the metal M. Examples of such compounds are disclosed in patent application WO98/58037 which describes a range of lanthanide complexes and also those disclosed in U.S. Pat. Nos. 6,524,727, 6,565,995, 6,605,317, 6,717,354 and 7,183,008. The disclosure of each of these specifications is incorporated herein by reference.

Electron Transport Material

Kulkarni et al., Chem. Mater. 2004, 16, 4556-4573 (the contents of which are incorporated herein by reference) have reviewed the literature concerning electron transport materials (ETMs) used to enhance the performance of organic light-emitting diodes (OLEDs). In addition to a large number of organic materials, they discuss metal chelates including aluminium quinolate, which they explain remains the most widely studied metal chelate owing to its superior properties such as high EA (~−3.0 eV; measured by the present applicants as −2.9 eV) and IP (~−5.95 eV; measured by the present applicants as about −5.7 eV), good thermal stability (Tg ~172° C.) and ready deposition of pinhole-free thin films by vacuum evaporation. Aluminum quinolate remains a preferred material and a layer of aluminum quinolate may be incorporated as electron transport layer if desired.

Further preferred electron transport materials consist of or comprise zirconium, hafnium or lithium quinolate.

Zirconium quinolate has a particularly advantageous combination of properties for use as an electron transport material and which identify it as being a significant improvement on aluminium quinolate for use as an electron transport material. It has high electron mobility. Its melting point (388° C.) is lower than that of aluminium quinolate (414° C.). It can be purified by sublimation and unlike aluminium quinolate it resublimes without residue, so that it is even easier to use than aluminium quinolate. Its lowest unoccupied molecular orbital (LUMO) is at −2.9 eV and its highest occupied molecular orbital (HOMO) is at −5.6 eV, similar to the values of aluminium quinolate. Furthermore, unexpectedly, it has been found that when incorporated into a charge transport layer it slows loss of luminance of an OLED device at a given current with increase of the time for which the device has been operative (i.e. increases device lifetime), or increases the light output for a given applied voltage, the current efficiency for a given luminance and/or the power efficiency for a given luminance. Embodiments of cells in which the electron transport material is zirconium quinolate can exhibit reduced turn-on voltage and up to four times the lifetime of similar cells in which the electron transport material is zirconium quinolate. It is compatible with aluminium quinolate when aluminium quinolate is used as host in the electroluminescent layer of an OLED, and can therefore be employed by many OLED manufacturers with only small changes to their technology and equipment. Of course zirconium quinolate can be used both as host in the electroluminescent layer and as electron transfer layer. The properties of hafnium quinolate are generally similar to those of zirconium quinolate.

Zirconium or hafnium quinolate may be the totality, or substantially the totality of the electron transport layer. It may be a mixture of co-deposited materials which is predominantly zirconium quinolate. The zirconium or hafnium may be doped as described in GB 06 14847.2 filed 26 Jul. 2006, the contents of which are incorporated herein by reference. Suitable dopants include fluorescent or phosphorescent dyes or ion fluorescent materials e.g. as described above in relation to the electroluminescent layer, e.g. in amounts of 0.01-25 wt % based on the weight of the doped mixture. Other dopants include metals which can provide high brightness at low voltage. Additionally or alternatively, mixtures of metal quinolates may be used e.g. the zirconium or hafnium quinolate may be used in admixture with another electron transport material. Such materials may include complexes of metals in the univalent, divalent, trivalent or pentavalent state which should further increase electron mobility and hence conductivity. The zirconium and hafnium quinolate may be mixed with a quinolate of a metal of group 1, 2, 3, 13 or 14 of the periodic table, e.g. lithium quinolate or zinc quinolate. Preferably the zirconium or hafnium quinolate comprises at least 30 wt % of the electron transport layer, more preferably at least 50 wt %.

Donor or n-type doping of the electron transfer layer e.g. with lithium or with an organic molecule e.g. 2-(4-biphenyl)-5-(4-tert-butylphenyl)-1,3,4-oxadiazole (PBD) is also possible.

Electron Injection Layer

The electron injection layer is a distinct layer of lithium quinolate or a substituted lithium quinolate.

The lithium quinolate acts to lower the work function of the cathode and enables the electroluminescent device to operate at a lower voltage and improves the lifetime and performance of the device. They have been found superior to the previously used lithium fluoride. They have significantly lower evaporation temperatures, as is apparent from the table below:

| Material | Evaporation Temperature/° C. | Vacuum Pressure/Pa | Evaporation Rate/Å s$^{-1}$ |
|---|---|---|---|
| Zrq$_4$ | 280 | ≤5 × 10$^{-5}$ | 1.0 |
| Liq | 320 | ≤5 × 10$^{-5}$ | 1.0 |
| LiF | 580 | ≤5 × 10$^{-5}$ | 0.1 |

Suitable quinolates have the formula

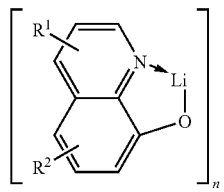

(I)

wherein $R^1$ and $R^2$ which may be the same or different and may be on the same or different rings are selected from hydrogen, $C_1$-$C_4$ alkyl and substituted or unsubstituted monocyclic or polycyclic aryl or heteroaryl, aralk-($C_1$-$C_4$)-yl or aryloxy; and n is an integer from 2 to 6.

Crystallographic evidence for such oligomers is given by Begley et al., *Acta Cyst.* (2006), E62, m1200-m1202. Lithium quinolate is said to have a doubly stacked trimeric structure $(Li_3q_3)_2$ in which the trimeric unit is of formula:

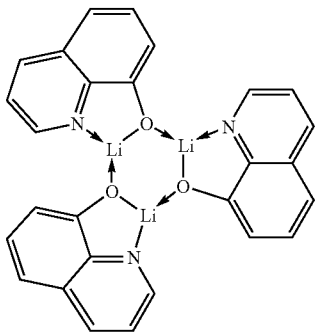

Each trimer is composed of a six membered ring of alternating O and Li atoms, with one ring rotated 60° relative to the other, allowing for alternating O and Li atoms not only within the rings but also between the rings. In addition to the O atom of the quinolin-8-olate, the quinoline N atom is also involved in coordination to lithium, resulting in a coordination number of four for each Li atom in the structure. Each six-membered ring is planar, resulting in a hexagonal prism of alternating O and Li atoms that represents the core structure. The applicants believe, from MS data, that oligomers form not only with lithium quinolate but also with substituted quinolates but only or very preferentially when the solvent is acetonitrile the lithium compound is made from a lithium alkyl or alkoxide and 8-hydroxyquinoline or a substituted derivative thereof and the solvent contains or preferably consists of acetonitrile.

Cathode

The cathode on which there is the layer of the metal quinolate is preferably a low work function metal, e.g. aluminium, barium, calcium, lithium, rare earth metals, transition metals, magnesium and alloys thereof such as silver/magnesium alloys, rare earth metal alloys etc; aluminium is a preferred metal. The metal electrode may consist of a plurality of metal layers; for example a higher work function metal such as aluminium deposited on the substrate and a lower work function metal such as calcium deposited on the higher work function metal. The work function of some metals are listed below in Table 1:

TABLE 1

| Metal | Work Function eV* |
|---|---|
| Li | 2.9 |
| Na | 2.4 |
| K | 2.3 |
| Cs | 1.9 |
| Ba | 2.5 |
| Ca | 2.9 |
| Nb | 2.3 |
| Zr | 4.05 |
| Mg | 3.66 |
| Al | 4.2 |
| Cu | 4.6 |
| Ag | 4.64 |
| Zn | 3.6 |
| Sc | 3.5 |

*Handbook of Chemistry and Physics

The layer of the metal quinolate is preferably about 0.3 nm in thickness and preferably has a work function of less than magnesium 3.7 eV, this being regarded for present purposes as a low work function.

EXAMPLES

How the invention may be put into effect will now be described with reference to the following non-limitative Examples.

Example 1

Preparation and Evaporation of Quinolates

The following compounds were made by reacting a lithium alkyl or alkoxide in acetonitrile according to the procedure disclosed in EP-B-1144543 (WO 00/32717), the contents of which are incorporated herein by reference:

| Structure | Mass Spec. Observed (Multiple) | E.A. (%) | | M. Pt. DSC Peak ° C. | UV-Vis. Solution (THF) | | FL. (($\lambda_{max}$/nm) | |
|---|---|---|---|---|---|---|---|---|
| | | Theory | Found | | $\lambda_{max}$/nm | $\epsilon_{nm}$/×10$^4$ mol$^{-1}$dm$^2$ | Solution | Powder |
| Liq | 919 (6) 766 (5) 613 (4) 460 (3) 307 (2) 151 (1) | C = 71.54 H = 4.00 N = 9.27 | C = 71.62 H = 4.89 N = 9.26 | 366 | 387 (Peak) 337 (Shoulder) | 1.58 (Peak) 2.51 (Shoulder) | 497 | 468 |

-continued

| Structure | Mass Spec. Observed (Multiple) | E.A. (%) Theory | E.A. (%) Found | M. Pt. DSC Peak (°C.) | UV-Vis. Solution (THF) $\lambda_{max}$/nm | UV-Vis. Solution (THF) $\epsilon_{nm}/\times 10^4 \, mol^{-1}dm^2$ | FL. (($\lambda_{max}$/nm) Solution | FL. (($\lambda_{max}$/nm) Powder |
|---|---|---|---|---|---|---|---|---|
| Compound Y | 656 (4) 460 (3) 330 (2) 165 (1) | C = 72.74 H = 4.88 N = 8.48 | C = 72.78 H = 4.82 N = 8.46 | 399 | 378 (Peak) 340 (Shoulder) | 1.85 (Peak) 2.05 (Shoulder) | 499 | 434 |
| Compound Z | 738 (4) 550 (3) 378 (2) 179 (1) | C = 73.75 H = 5.63 N = 7.82 | C = 74.02 H = 5.68 N = 7.91 | 396 | 349 (Peak) 393 (Shoulder) | 3.44 (Peak) 1.98 (Shoulder) | 508 | 472 |
| Compound X | 557 (3) 313 (2) | C = 63.93 H = 2.98 N = 8.28 | C = 64.17 H = 3.01 N = 8.18 | 341 | Not determined | Not Determined | Not determined | Not determined |

Observed MS peaks, as indicated in the above table, indicated that the compounds formed oligomeric species whose use is included within the invention. As used herein reference to a compound includes reference to oligomeric forms thereof.

Using a Solciet vacuum evaporator (ULVAC Ltd. Chigacki, Japan) the evaporation rates as a function of temperature for lithium fluoride, lithium quinolate and compounds Y and Z below were measured. The results were as shown in FIG. 1. It will be apparent that lithium fluoride evaporates at between 500 and 600° C., whereas metal quinolates evaporate at about 300° C., the volatilities of the compounds tested being in the order Compound Z>Compound Y>Liq. Compound Y is lithium 2-methyl-quinolin-8-olate and compound Z is lithium 5,7-dimethyl-quinolin-8-olate.

Yields after first and second sublimations are as set out below (the compounds below being in the form of oligomers as determinable by MS):

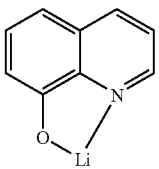

| | Yield after first sublimation (%) | Yield after second sublimation (%) |
|---|---|---|
| Liq | 76 | 91 |
| Compound Y | 93 | 95 |

| | Yield after first sublimation (%) | Yield after second sublimation (%) |
|---|---|---|
| 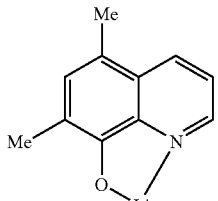 Compound 2 | 94 | 90 |

Example 2

Device Structure

A pre-etched ITO coated glass piece (10×10 cm$^2$) was used. The device was fabricated by sequentially forming layers on the ITO, by vacuum evaporation using a Solciet Machine. The active area of each pixel was 3 mm by 3 mm. The ITO electrode was always connected to the positive terminal. The current vs. voltage studies were carried out on a computer controlled Keithly 2400 source meter.

Example 3

Figure 2:
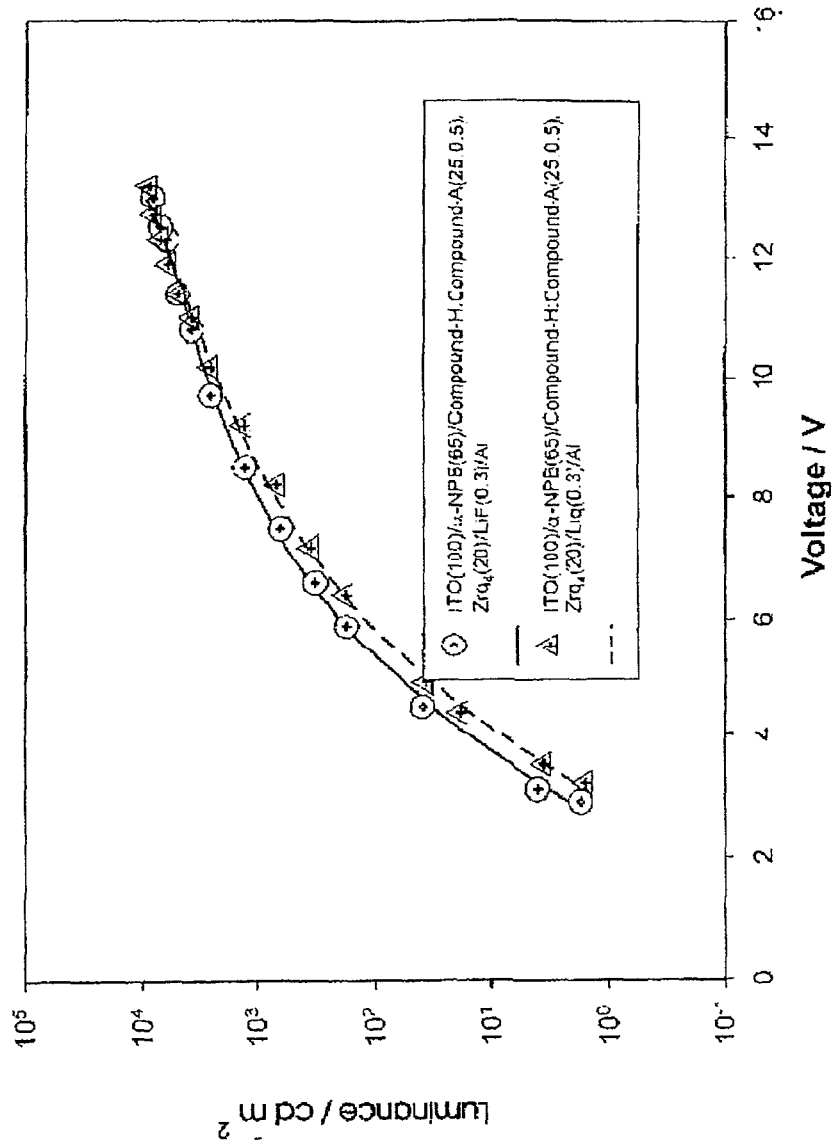
FIGS. 2-4 are performance graphs comparing lithium quinolate to lithium fluoride as electrode layers, specifically comparing luminance as a function of voltage (FIG. 2), power efficiency as a function of luminance (FIG. 3), and current efficiency as a function of luminance (FIG. 4) (as described in Example 3 hereinafter).
Figure 3:
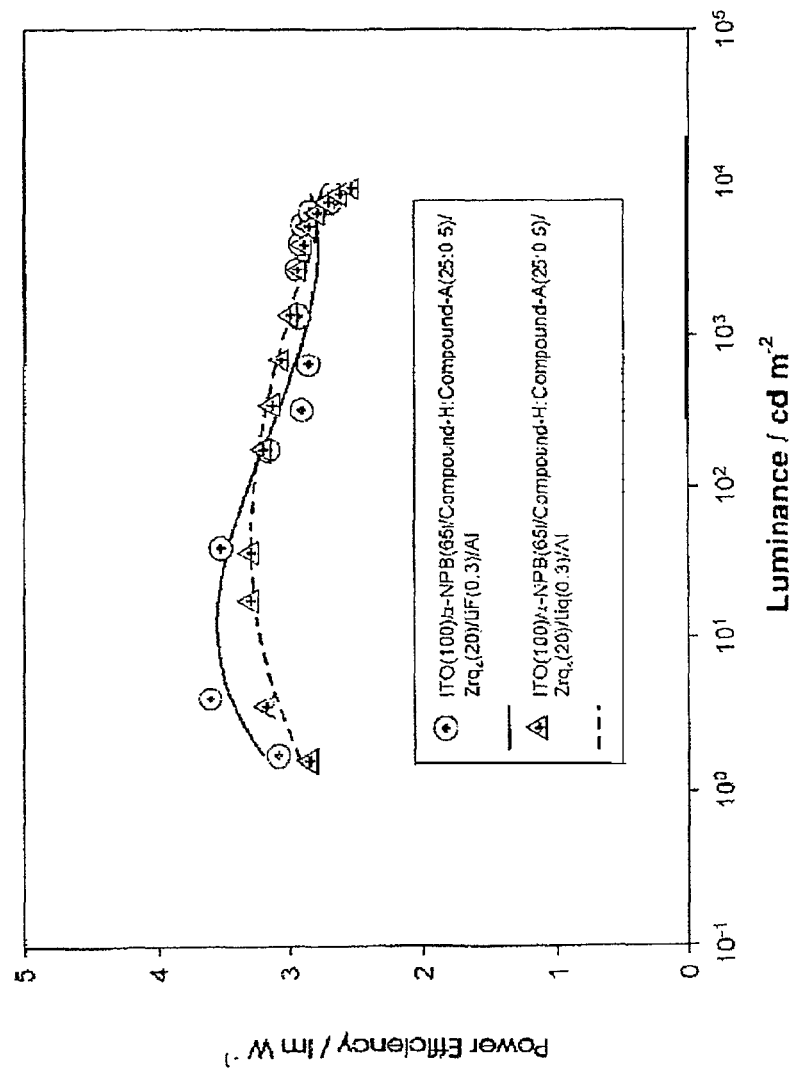
Figure 4:
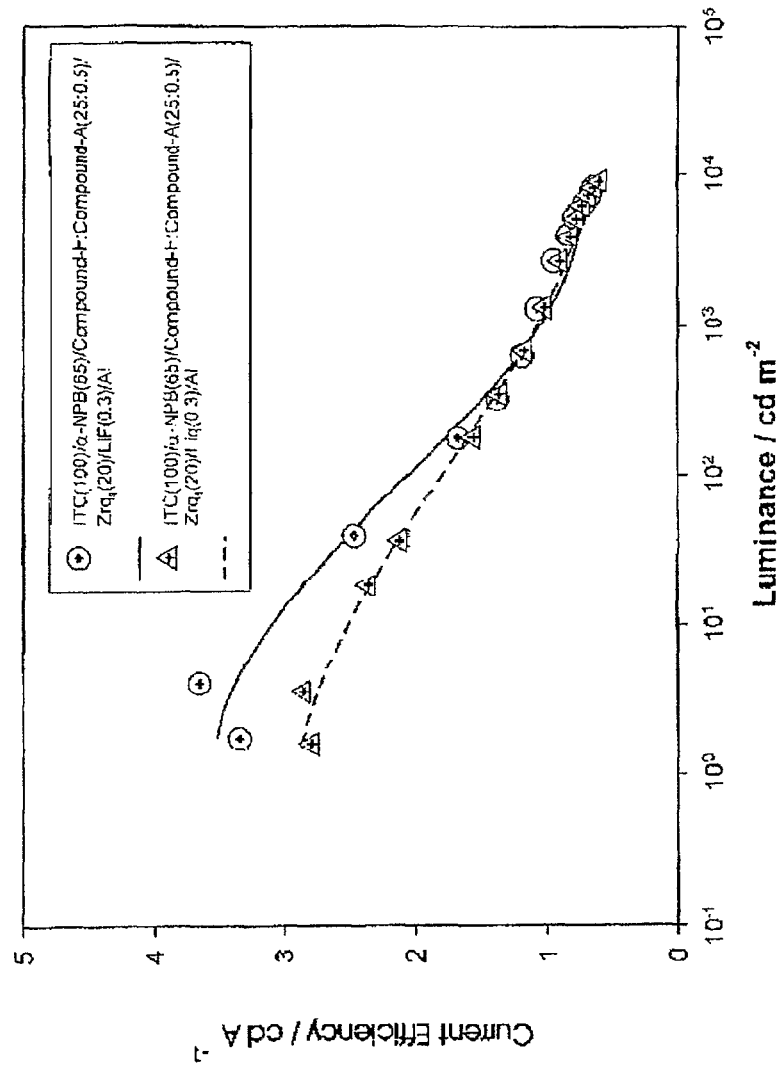
Figure 5:
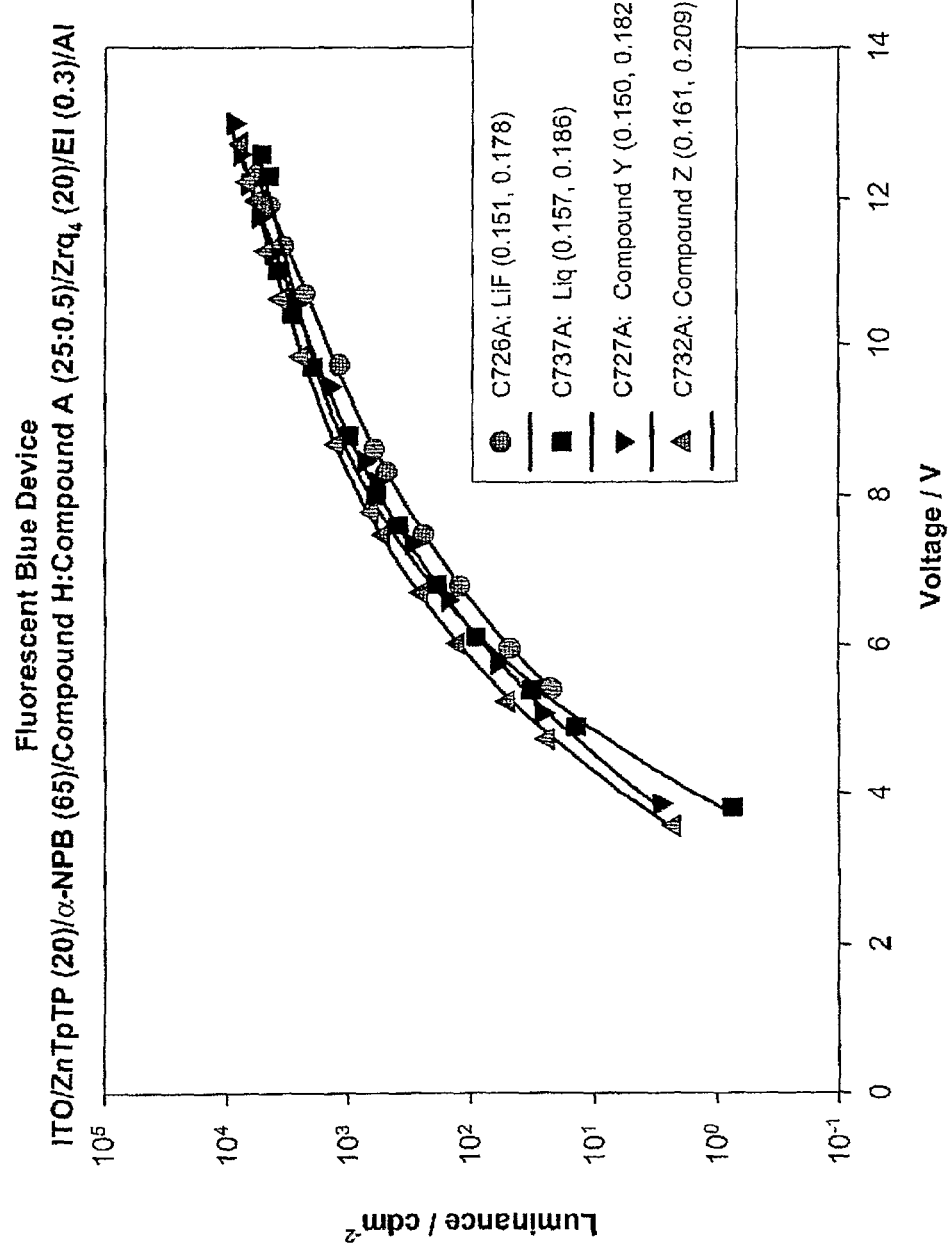
FIG. 5-8 are performance graphs comparing the performance of blue-fluorescent electroluminescent devices fabricated with various structures and layer compositions, specifically comparing luminance as a function of voltage (FIG. 5), current density as a function of voltage (FIG. 6), current efficiency as a function of luminance (FIG. 7), and power efficiency as a function of luminance (FIG. 8) (as described in Example 3 hereinafter).
Figure 6:
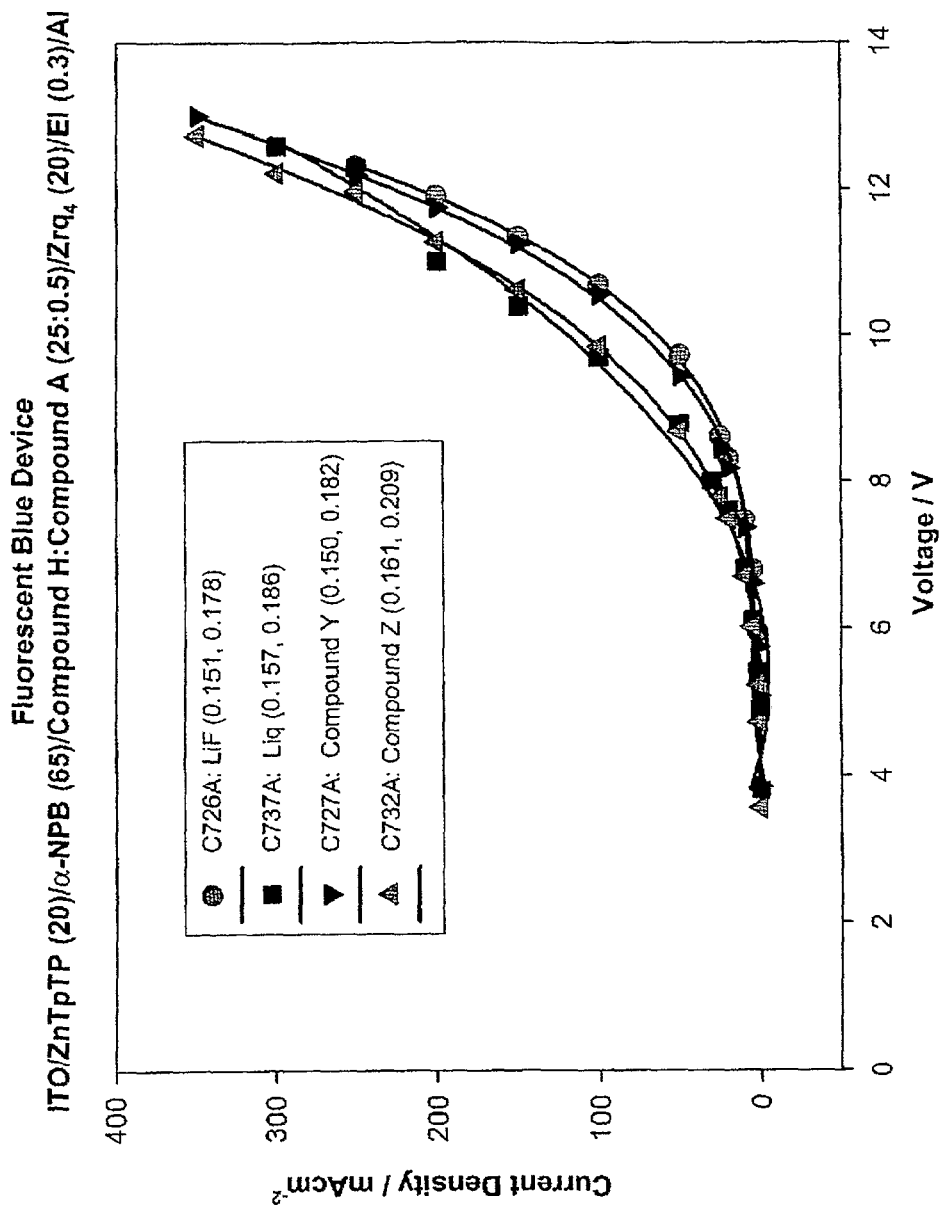
Figure 7:
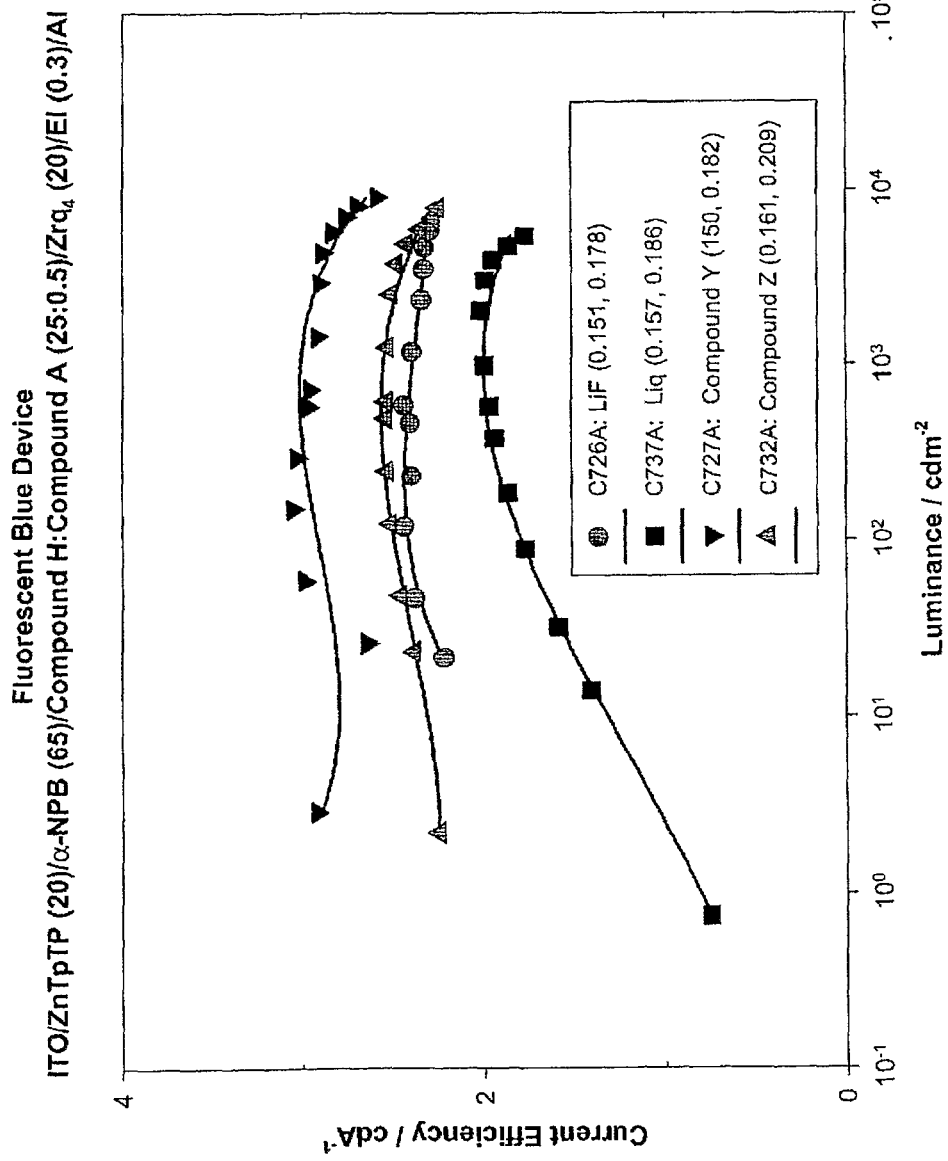
Figure 8:
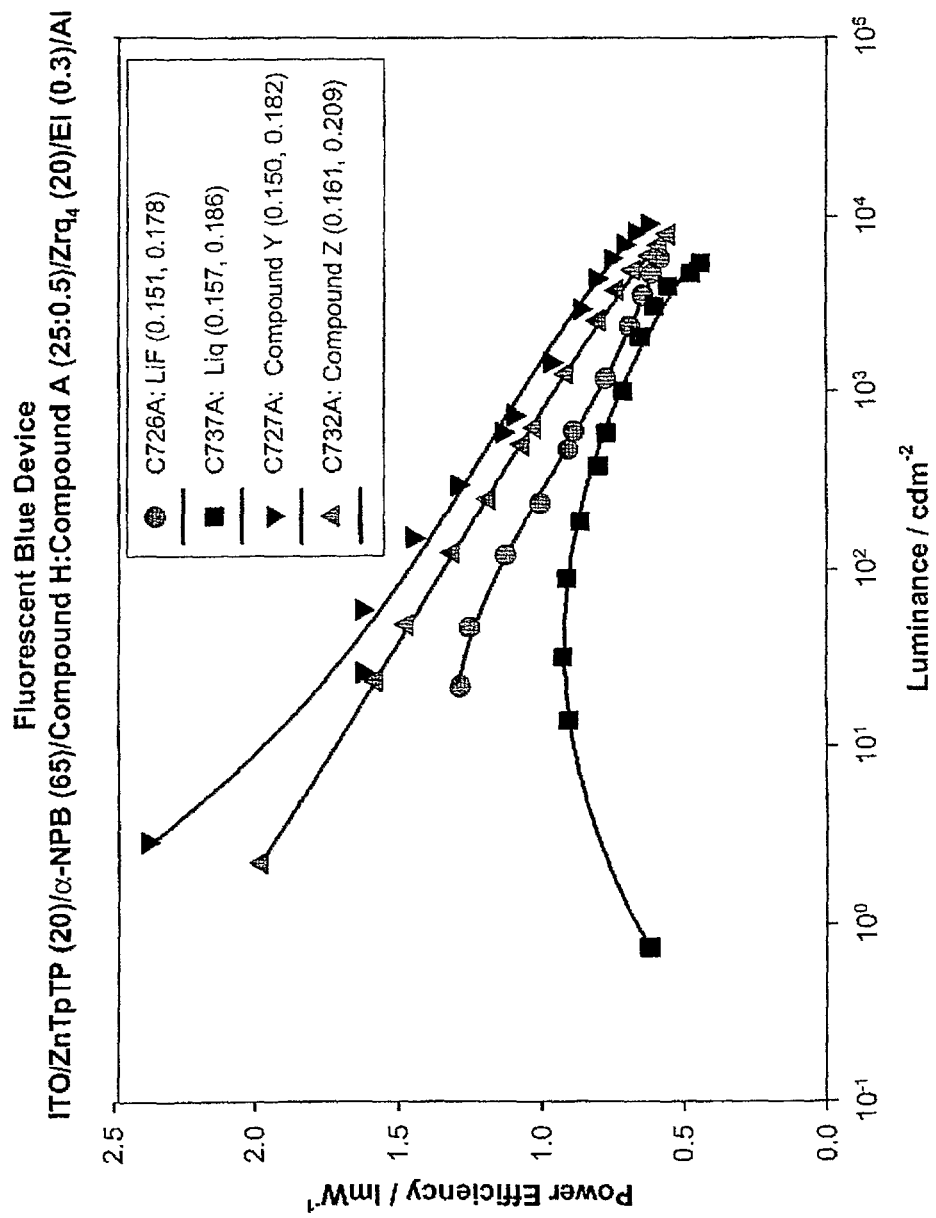
Figure 9:
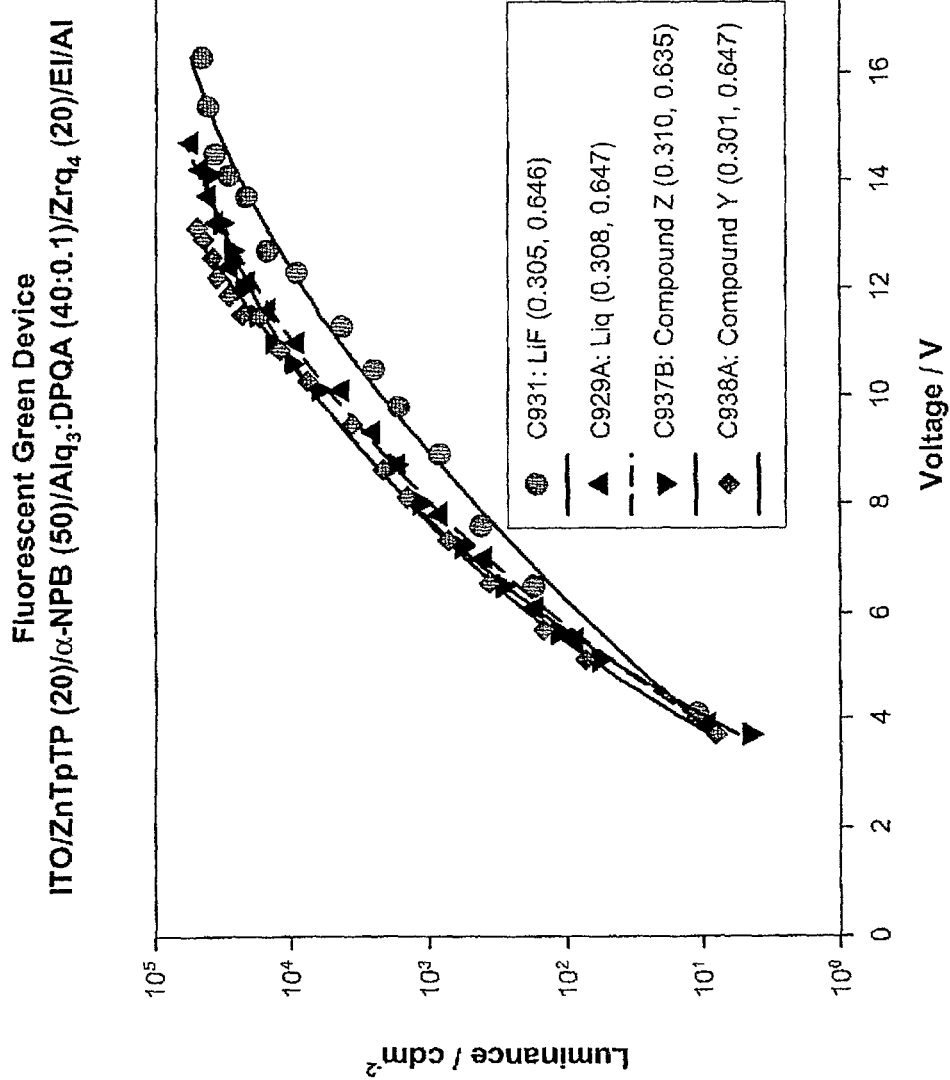
FIGS. 9-12 are performance graphs comparing the performance of green-fluorescent electroluminescent devices fabricated with various structures and layer compositions, specifically comparing luminance as a function of voltage (FIG. 9), current density as a function of voltage (FIG. 10), current efficiency as a function of luminance (FIG. 11), and power efficiency as a function of luminance (FIG. 12) (as described in Example 4 hereinafter).
Figure 10:
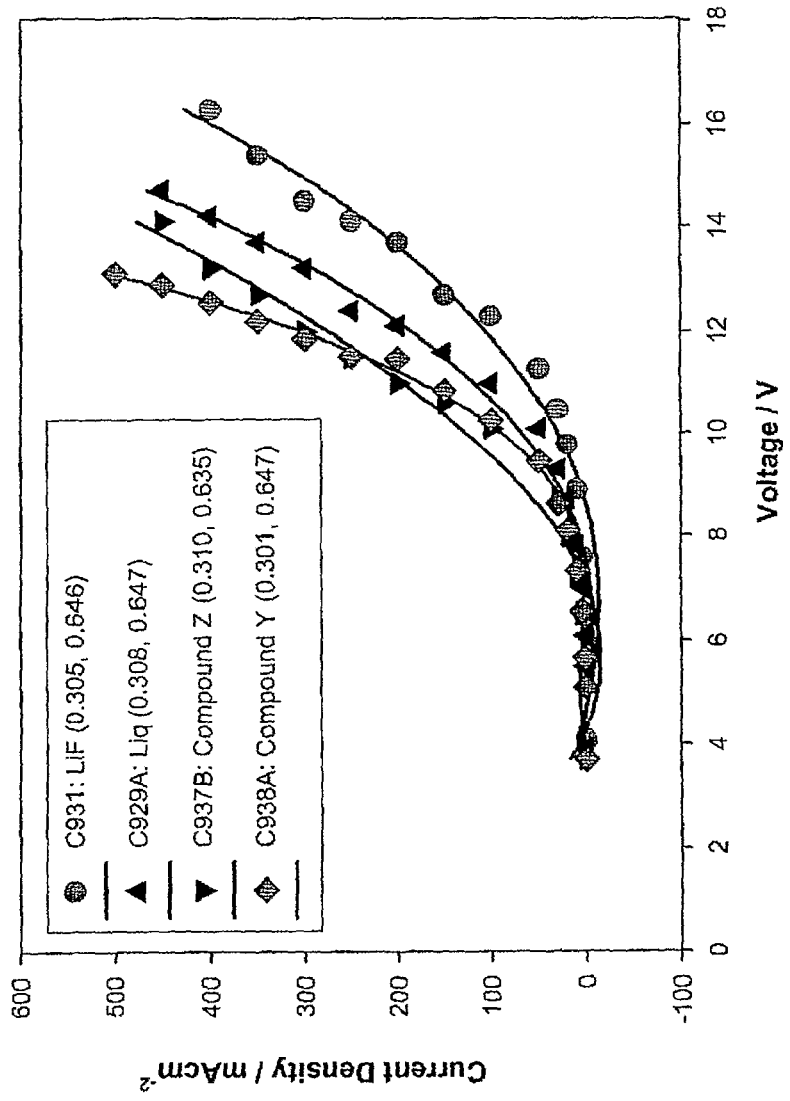
Figure 11:
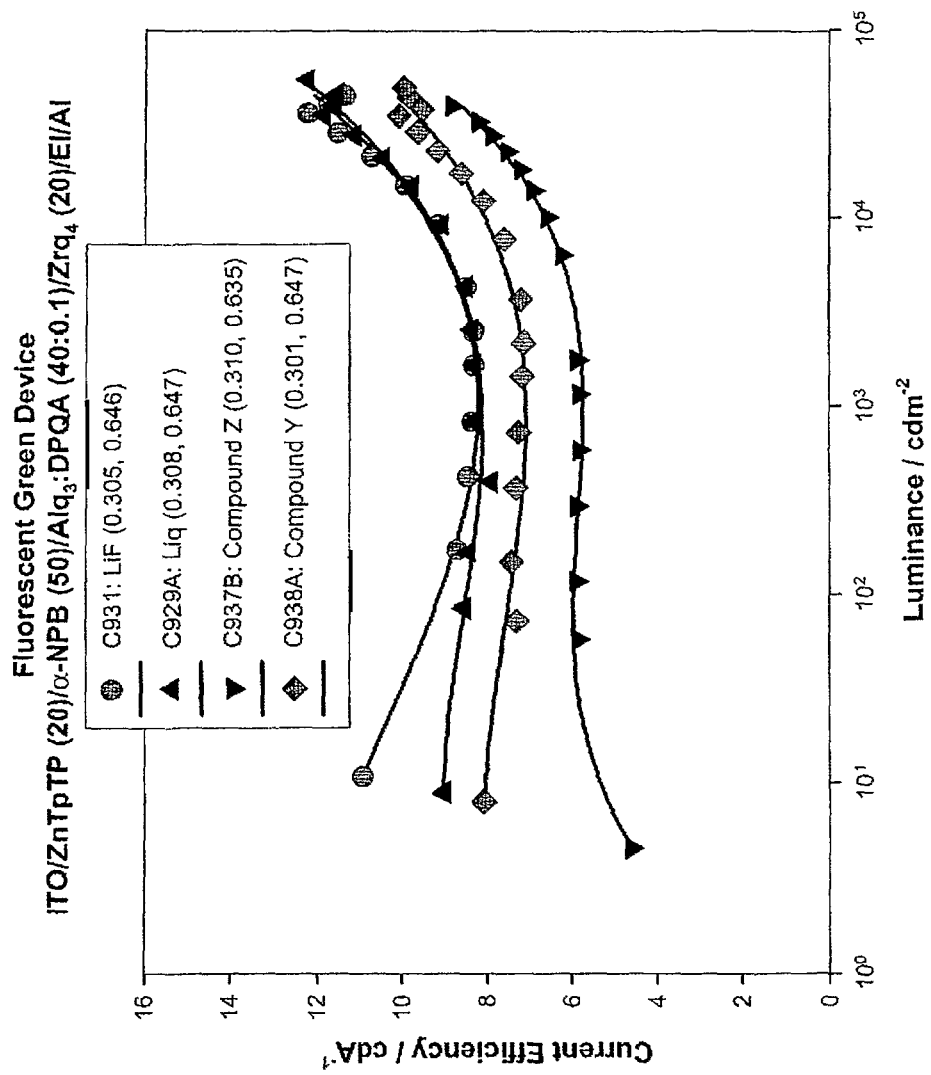
Figure 12:
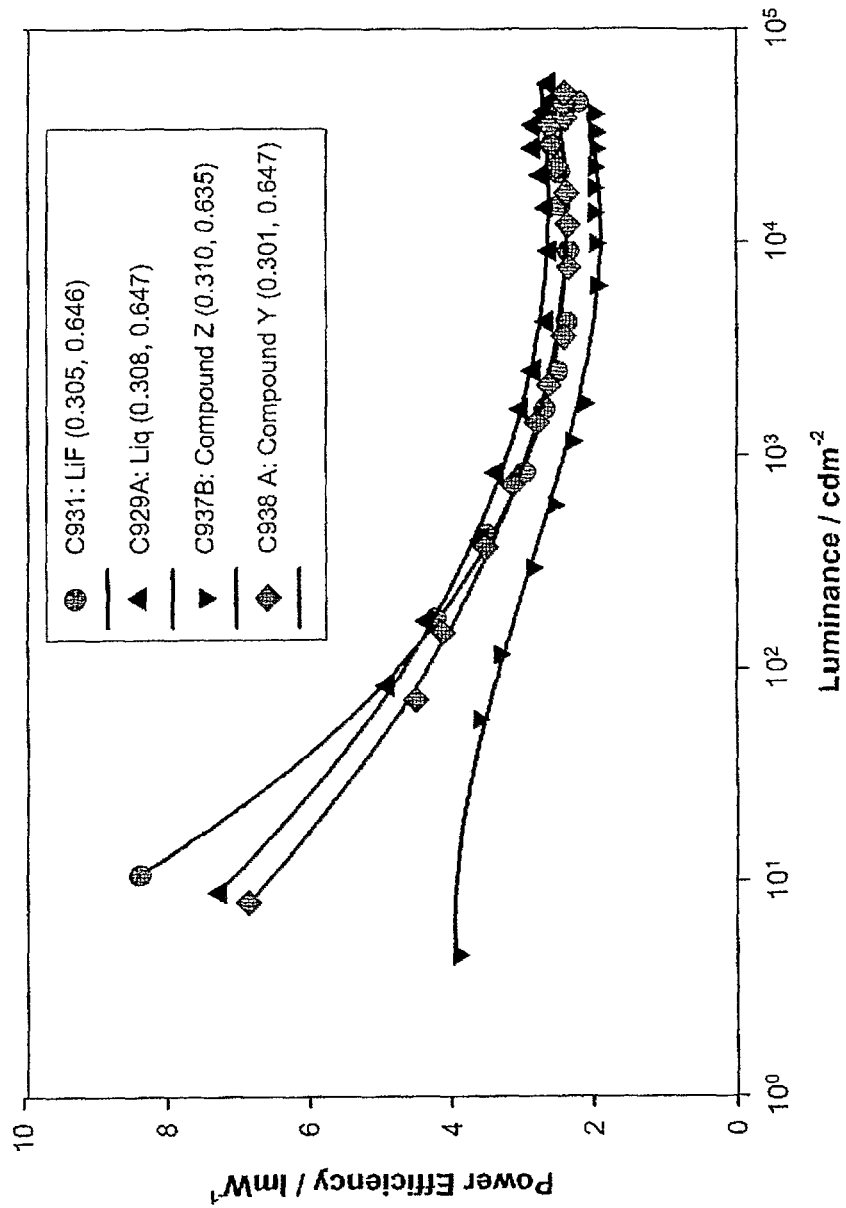

Two devices were formed by the method of Example 2 using lithium fluoride and lithium quinolate as a cathode layer; the devices consisted of
(i) ITO(100)/α-NPB(65)/Compound-H:Compound-A (25:0.5)/Zrq$_4$/LiF(0.3)/Al
(ii) ITO(100)/α-NPB(65)/Compound-H:Compound-A (25:0.5)/Zrq$_4$(20)/Liq(0.3)/Al where α-NPB is as shown above; compound is 2,6-di-tert-butyl-9-naphthalen-2-ylmethyl-10-naphthalen-1-ylmethyl-anthracene shown below and compound H is 4,4'-bis-(2,2-diphenyl-vinyl)-biphenyl shown below; Zrq$_4$ is zirconium quinolate; LiF is lithium fluoride; Liq is lithium quinolate. The performance of the devices was measured and the results shown in FIGS. 2 to 4. As can be seen the lithium quinolate was at least as effective as the lithium fluoride as a layer on the cathode.

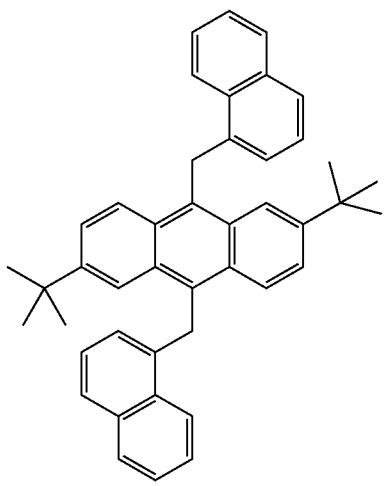

Compound-A

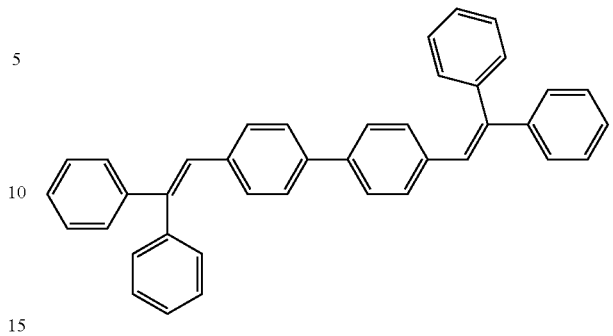

Compound-H

Further blue-fluorescent devices were made using the method of Example 2 and having the structure and layer composition indicated in FIGS. 5-8. The performance of the devices was as indicated in those figures.

Example 4

Figure 13:
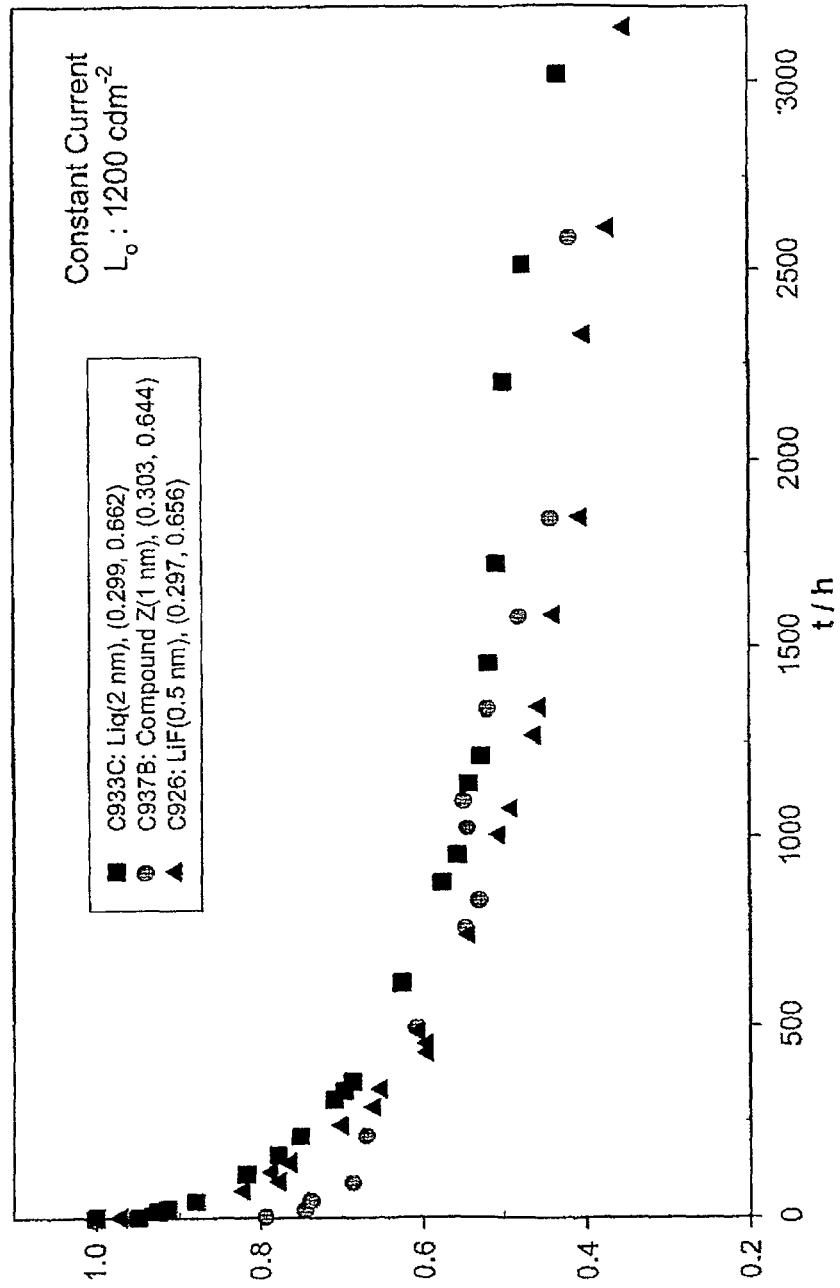
FIG. 13 is a graph illustrating the performance over time of the several types of green-fluorescent electroluminescent devices represented by FIGS. 9-12 (as described in Example 4).

Green-fluorescent devices were made using the method of Example 2 and having the structure and layer composition indicated in FIGS. 9-12. The performance of the devices was as indicated in those figures and lifetime is indicated in FIG. 13.

The invention claimed is:

1. An electroluminescent device which comprises sequentially:
   (i) a transparent anode;
   (ii) a layer of a hole transporting material;
   (iii) a layer of an electroluminescent material;
   (iv) a layer of an electron transporting material,
   (v) an electron injection layer distinct from the layer of electroluminescent material and also from the layer of electron transporting material, the electron injection layer consisting essentially of an oligomer of a substituted lithium quinolate having one or more substituents selected from the group consisting of $C_1$-$C_4$ alkyl, monocyclic aryl and aralk-($C_1$-$C_4$)-yl, subject to the proviso that not more than one substituent is $C_2$-$C_4$ alkyl or aralk-($C_1$-$C_4$)-yl, and
   (vi) a metal cathode.

2. The device of claim 1, wherein the oligomer of a substituted lithium quinolate is the result of reacting a lithium alkyl compound with a substituted 8-hydroxyquinoline in a solvent which comprises acetonitrile.

3. The device of claim 2, wherein the electron injection layer consists essentially of an oligomer of a substituted lithium quinolate having one or two substituents selected from the group consisting of $C_1$-$C_4$ alkyl and monocyclic aryl, subject to the proviso that not more than one substituent is $C_2$-$C_4$ alkyl.

4. An electroluminescent device having a cathode formed with distinct electron injection and electron transport layers thereon, wherein the electron injection layer consists essentially of an oligomer of a substituted lithium quinolate having one or more substituents selected from the group consisting of $C_1$-$C_4$ alkyl, monocyclic aryl and aralk-($C_1$-$C_4$)-yl, subject to the proviso that not more than one substituent is $C_2$-$C_4$ alkyl or aralk-($C_1$-$C_4$)-yl.

5. The device of claim 1, wherein the layer of an electron transporting material is selected from the group consisting of aluminum, zirconium and hafnium quinolate, or a mixture thereof.

6. The device of claim 1, wherein the electron injection layer is selected from the group consisting of lithium 2-methyl-quinolin-8-olate and lithium 5,7-dimethyl-quinolin-8-olate.

7. An electroluminescent device which comprises sequentially:
(i) a first electrode;
(ii) a layer of an electroluminescent material; and
(iii) a second electrode on which there are an electron injection layer of a material that is different from the layer of electroluminescent material, wherein the electron injection layer consists essentially of an oligomer of a substituted lithium quinolate having one or more substituents selected from the group consisting of $C_1$-$C_4$ alkyl, monocyclic aryl or aralk-($C_1$-$C_4$)-yl, subject to the proviso that not more than one substituent is $C_2$-$C_4$ alkyl or aralk-($C_1$-$C_4$)-yl, and an electron transporting layer of a material that is different from the electron injection layer between the second electrode and the layer of electroluminescent material.

8. An electroluminescent device having a cathode formed with electron injection and electron transport layers sequentially thereon, wherein the electron injection layer is distinct from the electron transport layer and consists essentially of a substituted lithium quinolate having the formula

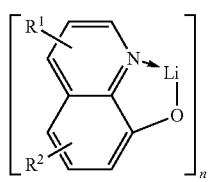

(I)

wherein $R^1$ and $R^2$, which may be the same or different, and may be on the same or different rings, are selected from $C_1$-$C_4$ alkyl, monocyclic aryl and aralk-($C_1$-$C_4$)-yl, subject to the proviso that not more than one substituent is $C_2$-$C_4$ alkyl or aralk-($C_1$-$C_4$)-yl, and also wherein n is an integer from 2 to 6.

9. The device of claim 7, wherein the cathode second electrode is selected from the group consisting of aluminum, barium, calcium, lithium, rare earth metals, transition metals, magnesium and magnesium alloys, rare earth metal alloys and a plurality of metal layers.

10. A method of making an electroluminescent device that includes the steps of:
forming an oligomer of a substituted lithium quinolate having one or more substituents selected from the group consisting of $C_1$-$C_4$ alkyl, monocyclic aryl and aralk-($C_1$-$C_4$)-yl, subject to the proviso that not more than one substituent is $C_2$-$C_4$ alkyl or aralk-($C_1$-$C_4$)-yl, by reacting a lithium alkyl compound with a substituted derivative of 8-hydroxyquinoline in a solvent comprising acetonitrile;
vaporizing the substituted lithium quinolate and depositing a layer of the substituted lithium quinolate, formed as described above, on a cathode of the device to provide an electron injection layer; and
depositing a layer of an electron transport material that is different from the electron injection layer on the side of the electron injection layer opposite the cathode.

11. An organic light-emitting device having:
a cathode;
a substituted lithium quinolate electron injection layer in contact with the cathode; and
an electron transport layer in contact with the electron injection layer comprising a metal quinolate that is different from the substituted lithium quinolate electron injection layer; and
also wherein the electron injection layer consists essentially of a substituted lithium quinolate or an oligomer thereof having one or more substituents selected from the group consisting of $C_1$-$C_4$ alkyl, monocyclic aryl and aralk-($C_1$-$C_4$)-yl, subject to the proviso that not more than one substituent is $C_2$-$C_4$ alkyl or aralk-($C_1$-$C_4$)-yl.

12. The device of claim 11, wherein the electron injection layer consists essentially of a substituted lithium quinolate having one or two substituent groups selected from $C_1$-$C_4$ alkyl or monocyclic aryl, subject to the proviso that not more than one substituent is $C_2$-$C_4$ alkyl.

13. An organic light-emitting device having:
a cathode;
a substituted lithium quinolate electron injection layer selected from the group consisting of lithium 2-methyl-quinolin-8-olate or lithium 5,7-dimethyl-quinolin-8-olate in contact with the cathode; and
an electron transport layer in contact with the electron injection layer, said electron transport layer comprising a material that is different from the electron injection layer and is selected from aluminum, zirconium or hafnium quinolate, or a mixture thereof, or a mixture of any of them with a quinolate of a metal of group 1, 2, 3, 13 or 14 of the periodic table.

14. The device of claim 11, wherein the electron transport layer is selected from the group consisting of aluminum quinolate, zirconium quinolate and hafnium quinolate.

15. The device of claim 11, wherein the electron transport layer is in contact with a layer of electroluminescent material that is different from the substituted lithium quinolate electron injection layer.

16. An electroluminescent device having a cathode formed with distinct electron injection and electron transport layers sequentially thereon, wherein the electron injection layer consists essentially of a substituted lithium quinolate having one or two substituent groups selected from $C_1$-$C_4$ alkyl and monocyclic aryl subject to the proviso that not more than one substituent is $C_2$-$C_4$ alkyl and the electron transport layer comprises a metal quinolate that is different from the substituted lithium quinolate electron injection layer.

17. An electroluminescent device having a cathode formed with distinct electron injection and electron transport layers thereon, wherein the electron injection layer consists essentially of a substituted lithium quinolate having one or two substituent groups selected from $C_1$-$C_4$ alkyl and monocyclic aryl subject to the proviso that not more than one substituent is $C_2$-$C_4$ alkyl.

18. An electroluminescent device according to claim 7 wherein the oligomer of a substituted lithium quinolate has one or two substituent groups selected from $C_1$-$C_4$ alkyl, subject to the proviso that not more than one substituent is $C_2$-$C_4$ alkyl.

19. An electroluminescent device which comprises sequentially:
a first electrode;
(ii) a layer of an electroluminescent material; and
(iii) a second electrode on which there are sequentially deposited distinct electron injection and electron transport layers of different materials wherein the electron injection layer consists essentially of an oligomer of a substituted lithium quinolate selected from the group consisting of lithium 2-methyl-quinolin-8-olate and lithium 5,7-dimethyl-quinolin-8-olate.

20. A method of making an electroluminescent device according to claim 10 wherein the
substituted lithium quinolate has one or two substituent groups selected from $C_1$-$C_4$ alkyl and monocyclic aryl subject to the proviso that not more than one substituent is $C_2$-$C_4$ alkyl.

21. A method of making an electroluminescent device that includes the steps of:
forming an oligomer of substituted lithium quinolate selected from the group consisting of lithium 2-methyl-quinolin-8-olate and lithium 5,7-dimethyl-quinolin-8-olate by reacting a lithium alkyl compound with a substituted derivative of 8-hydroxyquinoline in a solvent comprising acetonitrile;
evaporating the substituted lithium quinolate below about 300° C. and depositing a layer of the substituted lithium quinolate, formed as described above, on a cathode of the device to provide an electron injection layer; and
depositing a layer of an electron transport material that is different from the electron injection layer on the electron injection layer.

22. The device of claim 8 wherein at least one of $R^1$ and $R^2$ is selected from $C_1$-$C_4$ alkyl, subject to the proviso that not more than one substituent is $C_2$-$C_4$ alkyl.

23. The device of claim 8 wherein one of $R^1$ and $R^2$ is a methyl group and the other of $R^1$ and $R^2$ is selected from $C_1$-$C_4$ alkyl.

24. The device of claim 8 wherein $R^1$ and $R^2$ are selected from $C_1$-$C_4$ alkyl and monocyclic aryl, subject to the proviso that not more than one substituent is $C_2$-$C_4$ alkyl.

25. The device of claim 16 wherein the electron injection layer consists essentially of a substituted lithium quinolate that has one or two substituent groups selected from $C_1$-$C_4$ alkyl, subject to the proviso that not more than one substituent is $C_2$-$C_4$ alkyl.

* * * * *